US008236644B2

(12) United States Patent
Cheng

(10) Patent No.: US 8,236,644 B2
(45) Date of Patent: Aug. 7, 2012

(54) TRENCH STRUCTURE AND METHOD OF FORMING THE TRENCH STRUCTURE

(75) Inventor: Kangguo Cheng, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 12/813,598

(22) Filed: Jun. 11, 2010

(65) Prior Publication Data

US 2010/0252873 A1 Oct. 7, 2010

Related U.S. Application Data

(62) Division of application No. 11/736,796, filed on Apr. 18, 2007, now Pat. No. 7,808,028.

(51) Int. Cl.
*H01L 21/8242* (2006.01)
*H01L 21/20* (2006.01)
(52) U.S. Cl. ........................ 438/243; 438/386
(58) Field of Classification Search ............ 438/243, 438/386; 257/301, 304, 305, 311, E21.396, 257/E21.651, E27.091, E29.346
See application file for complete search history.

(56) References Cited

U.S. PATENT DOCUMENTS

| | | | |
|---|---|---|---|
| 4,980,734 A | 12/1990 | Inoue | |
| 5,466,625 A | 11/1995 | Hsieh et al. | |
| 5,525,531 A | 6/1996 | Bronner et al. | |
| 5,528,062 A | 6/1996 | Hsieh et al. | |
| 5,585,285 A | 12/1996 | Tang | |
| 5,593,912 A | 1/1997 | Rajeevakumar | |
| 5,970,339 A | 10/1999 | Choi | |
| 5,976,945 A * | 11/1999 | Chi et al. ................. | 438/386 |
| 6,074,909 A | 6/2000 | Gruening | |
| 6,350,653 B1 | 2/2002 | Adkisson et al. | |
| 6,426,252 B1 | 7/2002 | Radens et al. | |
| 6,455,369 B1 * | 9/2002 | Forster et al. ................ | 438/249 |
| 6,472,702 B1 | 10/2002 | Shen | |
| 6,566,177 B1 | 5/2003 | Radens et al. | |
| 6,586,803 B2 | 7/2003 | Hidaka et al. | |
| 6,703,273 B2 | 3/2004 | Wang et al. | |
| 6,787,853 B2 | 9/2004 | Hidaka et al. | |
| 2002/0022308 A1 * | 2/2002 | Ahn et al. ................... | 438/164 |
| 2005/0212027 A1 | 9/2005 | Adam et al. | |
| 2005/0224852 A1 | 10/2005 | Cheng et al. | |
| 2006/0175660 A1 | 8/2006 | Cheng et al. | |

OTHER PUBLICATIONS

International Application No. PCT/US/08/60840, International Search Report, Jul. 18, 2008.
Kangguo Cheng, U.S. Appl. No. 11/736,796, Office Action Communication, Jun. 9, 2009, 5 pages.
Kangguo Cheng, U.S. Appl. No. 11/736,796, Office Action Communication, Apr. 5, 2010, 4 pages.
Kangguo Cheng, U.S. Appl. No. 11/736,796, Notice of Allowance, May 25, 2010, 3 pages.

* cited by examiner

*Primary Examiner* — Hung Vu
(74) *Attorney, Agent, or Firm* — Gibb & Riley, LLC; Joseph Petrokaitis, Esq.

(57) ABSTRACT

Disclosed are embodiments of an improved deep trench capacitor structure and memory device that incorporates this deep trench capacitor structure. The deep trench capacitor and memory device embodiments are formed on a semiconductor-on-insulator (SOI) wafer such that the insulator layer remains intact during subsequent deep trench etch processes and, optionally, such that the deep trench of the deep trench capacitor has different shapes and sizes at different depths. By forming the deep trench with different shapes and sizes at different depths the capacitance of the capacitor can be selectively varied and the resistance of the buried conductive strap which connects the capacitor to a transistor in a memory device can be reduced.

19 Claims, 11 Drawing Sheets

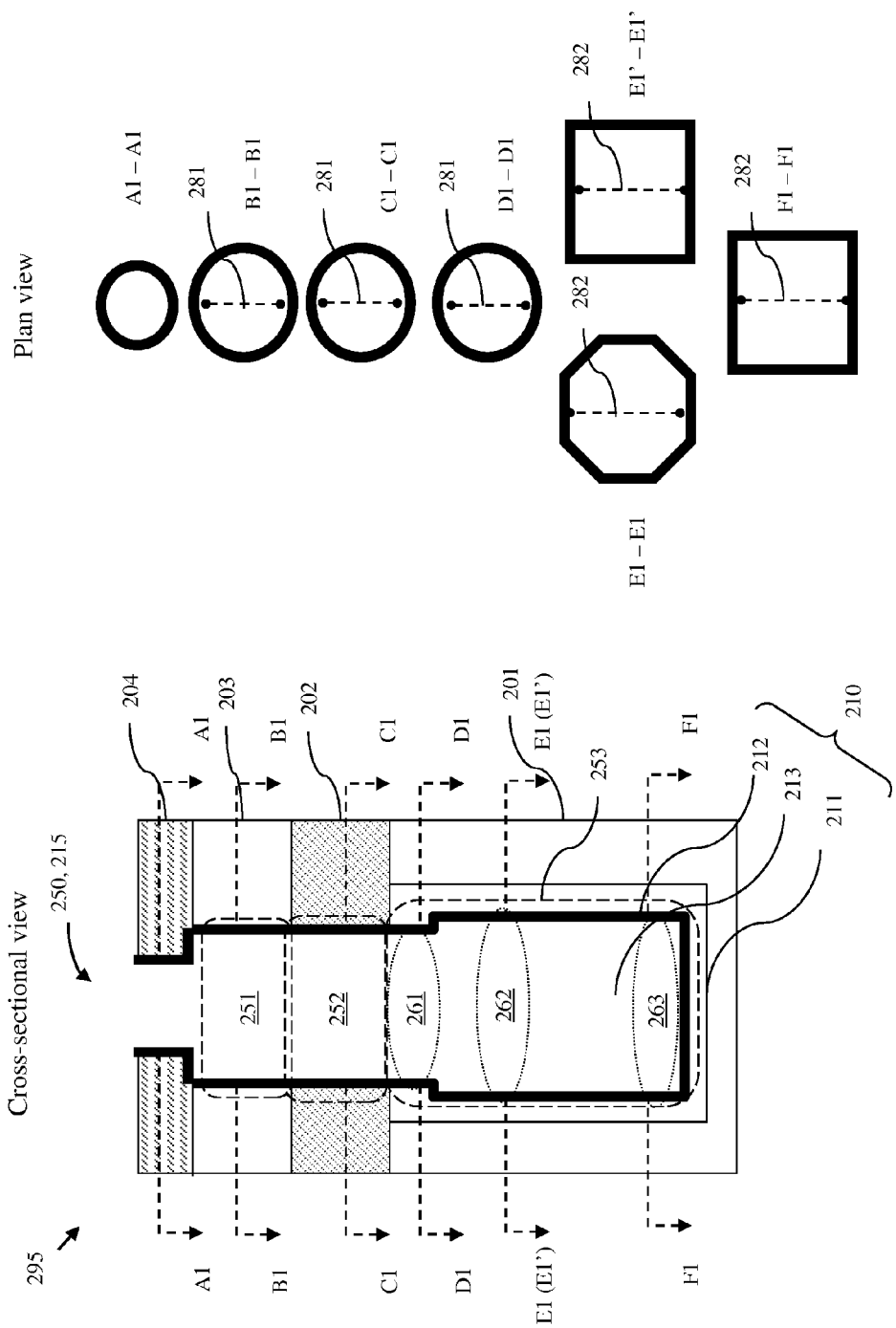

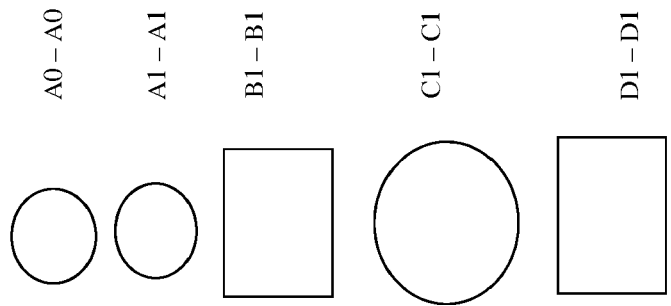
Plan view
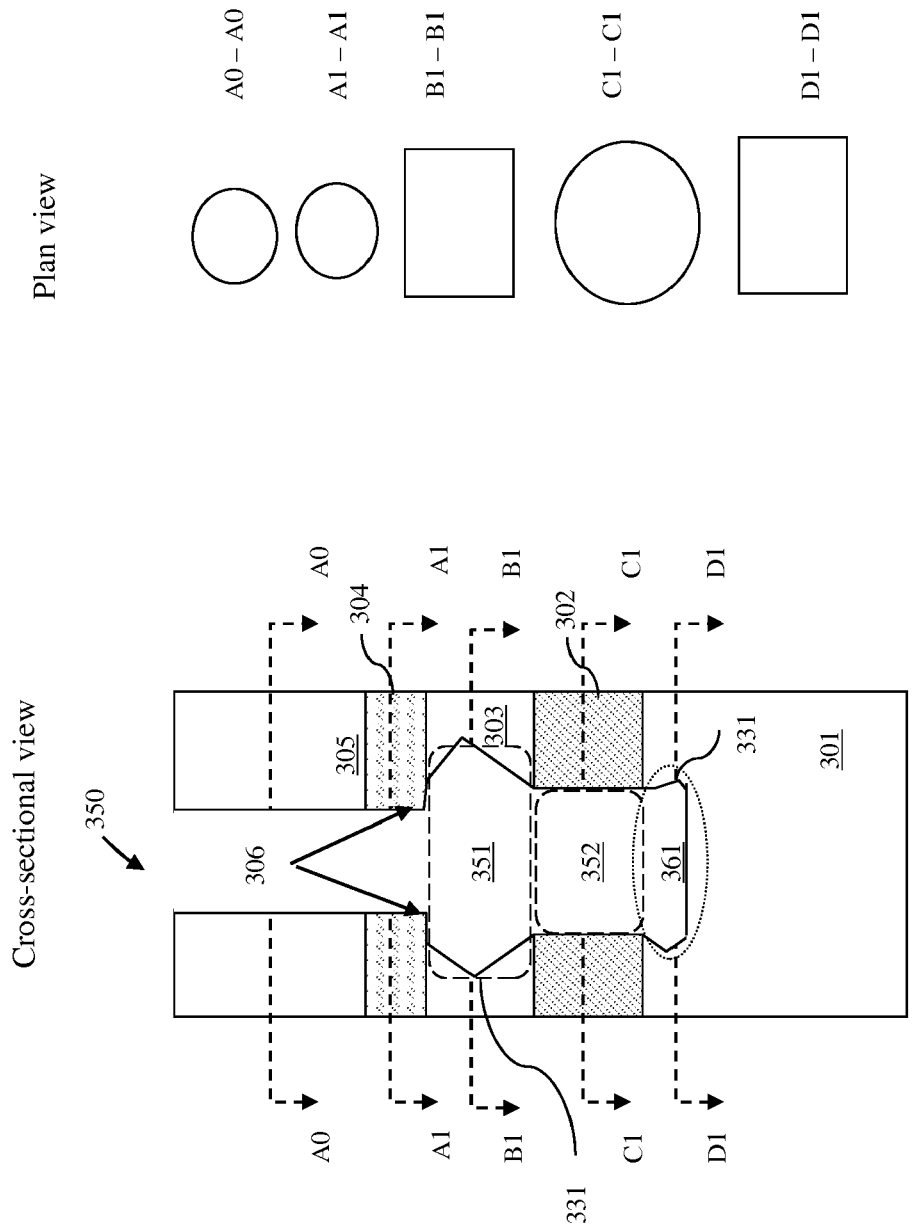
Cross-sectional view
Figure 13a
Figure 13b

TRENCH STRUCTURE AND METHOD OF FORMING THE TRENCH STRUCTURE

CROSS-REFERENCE TO RELATED APPLICATIONS

This application is a Division of U.S. application Ser. No. 11/736,796 filed Apr. 18, 2007, now U.S. Pat. No. 7,808,028 the complete disclosure of which, in its entirety, is herein incorporated by reference.

BACKGROUND

1. Field of the Invention

The embodiments of the invention generally relate to trench capacitors, and, more particularly, to a deep trench capacitor structure and method of forming the structure with semiconductor-on-insulator (SOI) technology.

2. Description of the Related Art

Trench capacitors are widely used in various semiconductor applications. For example, embedded dynamic random access memory (DRAM) technology, in which trench capacitors can be used, has played an important role in the emerging system-on-chip (SoC) products. Significant system performance gains have been demonstrated by integrating the embedded DRAM and logic units on the same chip. Given the enormous success of embedded DRAM technology achieved on bulk silicon substrates, integrating embedded DRAM with semiconductor-on-insulator (SOI) technology will further boost the performance of high-end SOI server chips.

SUMMARY

In view of the foregoing, disclosed herein are embodiments of an improved deep trench capacitor structure and a memory device (e.g., a DRAM device or an embedded DRAM device (eDRAM)) that incorporates this deep trench capacitor structure. The deep trench capacitor and memory device embodiments are formed on a semiconductor-on-insulator (SOI) wafer such that the insulator layer remains intact following a deep trench etch process and, optionally, such that the deep trench of the deep trench capacitor has different shapes and sizes at different depths. By forming the deep trench with different shapes and sizes at different depths the capacitance of the capacitor can be selectively varied and the resistance of the conductive strap which connects the capacitor to another device (e.g., to transistor in a memory device, such as a pass transistor in a DRAM or embedded DRAM device) can be reduced.

Also disclosed are embodiments of a method of forming the deep trench capacitor and the memory device that incorporates this deep trench capacitor. Specifically, during the deep trench capacitor formation process, the insulator layer of a semiconductor-on-insulator (SOI) wafer is protected by a spacer. However, by pulling back both the SOI and insulator layers prior to forming the spacer an overhang in a pad layer is created. This overhang prevents the subsequently formed spacer from being bombarded by plasma and ions and breaking during a deep trench reactive ion etch (RIE) process. The spacer can further be protected by forming a thin protection layer on top surface of the spacer prior to the RIE process. Since the protection layer has much greater resistance to the deep trench RIE process, the underlying spacer remains intact. Additionally, the processes used to etch each layer of the SOI wafer can be selectively varied so as to selectively vary the size and shape of the deep trench within the different layers and at different depths so as to selectively vary the capacitance of the deep trench capacitor as well as the resistance of the buried strap which connects the deep trench capacitor to another device (e.g., a transistor in a memory device).

More particularly, disclosed herein are embodiments of a semiconductor structure that comprises a deep trench. Specifically, the semiconductor structure can comprise a semiconductor-on-insulator (SOI) structure (e.g., an SOI wafer) comprising a semiconductor layer, an insulator layer below the semiconductor layer and a semiconductor substrate below the insulator layer.

The deep trench may comprise at least three different sections and can be filled with a conductive fill material. A first section of the deep trench can extend through the semiconductor layer. A second section of the deep trench can extend through the insulator layer. A third section of the deep trench can extend into the substrate. The trench can have different shapes and/or different widths at different depths. That is, the different sections of the trench as well as different portions of the third section can have different shapes and/or different widths at different depths.

For example, in one embodiment the first section, the second section and an upper portion of the third section of the deep trench can all have the same shape, such as an oval shape, (i.e., the same first shape). A mid-portion of the third section below the upper portion can have a second shape (e.g., an octagon shape or a rectangle shape) that is different from the first shape. Finally, a lower portion of the third section below the mid-portion can have a third shape that is also different from the first shape (e.g., a rectangle shape). In this embodiment, each of the sections can have the same width. However, the width of the deep trench can also vary between the sections and between the different portions within the sections. For example, the third section can be narrower or wider than the first and second sections. Alternatively, the first section, the second section and the upper portion of the third section can each have the same width (i.e., the same first width) and the mid and lower portions of the third section of the deep trench can be wider or narrower than that first width.

In another embodiment, the first section and an upper portion of the third section can each have approximately the same first shape, such as a rectangle shape, and the second section can have a second shape, such as an oval shape, that is different from the first shape. Additionally, a mid-portion of the third section below the upper portion can have a third shape that is different from the second shape and either the same or different from the first shape (e.g., either a rectangle or octagon shape). Finally, the lower portion of the third section below the mid-portion can also have a shape that is different from the second shape (e.g., the same rectangular shape as the first section and upper portion of the third section). As with the previously described embodiment, in this embodiment, each of the sections can have the same width. However, the width of the deep trench can also vary between the sections and between different portions within the sections. For example, the third section can be wider or narrower than the first and second sections. Alternatively, the first section, the second section and the upper portion of the third section can each have the same width (i.e., the same first width) and the mid and lower portions of the third section of the deep trench can be wider than that first width.

In both of these embodiments the semiconductor structure can comprise a capacitor in the substrate and, particularly, this capacitor can be formed using the third section of the deep trench. Specifically, this capacitor can comprise a dielectric liner lining the deep trench, a first conductive plate (e.g., either the substrate itself, if fully doped with an n-type or p-type dopant, or a region within the substrate that surrounds the third section of the trench and is doped with an n-type or p-type dopant), and a second conductive plate comprising the conductive fill material within the third section of the deep trench.

In both of these embodiments the semiconductor structure can further comprise a memory device (e.g., an embedded dynamic access memory (DRAM) device). This memory device can comprise a transistor formed on the same wafer and electrically connected to the capacitor. Specifically, the memory device can comprise a transistor comprising a source/drain region in the semiconductor layer adjacent to the first section of the deep trench and electrically connected to the capacitor via a conductive strap (i.e., the conductive fill material in the first section and the second section of the deep trench). Additionally, if the first section of the deep trench comprises a shape other than an oval (e.g., a rectangular shape with corners) the source/drain region can conform to one of the corners maximizing the surface area contact between the conductive strap and the source/drain region and, thereby, minimizing the resistance between the transistor and the capacitor.

Also disclosed are embodiments of methods of forming the semiconductor structure described above. The method embodiments each comprise providing a structure comprising a semiconductor layer on an insulator layer on a substrate (e.g., a semiconductor-on-insulator (SOI) wafer). Then, a pad layer (e.g., an optional pad oxide layer and a pad nitride layer) is formed on the semiconductor layer and a hard mask layer is formed on the pad layer.

Next, a first etch process can be performed which entails etching through the hard mask layer, through the pad layer, through the semiconductor layer and through the insulator layer to expose the substrate. Optionally, during this first etch process, the top surface of the substrate just below the insulator layer can also be etched. Performing this first etch process forms a first section of a deep trench in the semiconductor layer, a second section of the deep trench in the insulator layer and, if applicable, an over-etched upper portion of a third section of the deep trench in the substrate.

Then, the sidewalls of the first section of the trench in the semiconductor layer and the second section of the trench in the insulator layer can be pulled back (i.e., etched parallel to the substrate surface to remove portions of the semiconductor layer and insulator layer and widen the first and second sections of the trench) such that the edges of the pad layer overhang the first and second sections. This overhang protects a subsequently formed spacer from damage during subsequent deep trench etch processes (see discussion below). Additionally, if the top surface of the substrate was over-etched during the first etch process such that an upper portion of the third section of the trench is formed in the substrate, then the sidewalls of this upper portion can also be pulled back (i.e., etched parallel to the substrate surface to remove portions of the substrate and widen this upper portion of the third section of the trench) to further ensure that the insulator layer is protected by the spacer during the subsequent etch processes.

Next, the first section, the second section, and, if applicable, the upper portion of the third section of the deep trench can optionally be lined with a liner so as to improve adhesion and release stress (e.g., between the semiconductor layer and a subsequently formed spacer). Then, the spacer (e.g., a nitride spacer) is formed on the sidewalls of the first and second sections of the trench (and, if applicable, any exposed sidewalls within the substrate if the top surface of the substrate is etched during the first etch process). To further ensure that the spacer is protected during a subsequent deep trench etch processes (see discussion below), a protection layer can be formed on the spacer so as to form a multi-layer spacer. This protection layer can comprise a material (e.g., an oxide) with a substantially higher etch resistance than the spacer and can be formed, for example, by deposition or by converting the top surface of the spacer.

Next, a second etch process can be performed (i.e., a deep trench etch process). This second etch process can comprise etching the substrate such that the spacer remains intact and the third section of the trench is completely formed in the substrate. Optionally, after the second etch process is performed, the sidewalls of the exposed substrate within the third section can be pulled back (i.e., etched parallel to the substrate surface to remove portions of the substrate and widen the third section of the trench). Consequently, depending upon the various etch processes and pull back processes that are performed, the different sections of the deep trench (i.e., the first, second and third sections) as well as different portions of the third section (i.e., upper, mid and lower portions) can have different shapes and/or different widths at different depths.

For example, in one exemplary embodiment of the method, during the first etch process, the semiconductor layer, the insulator layer and the top surface of the substrate are all etched. Then, the sidewalls of the first section of the trench in the semiconductor layer, the sidewalls of the second section of the trench in the insulator layer and the sidewalls of the upper portion of the third section of the trench in the substrate are all pulled back using an isotropic etch process (e.g., a chemical wet etch) so that they have approximately the same shape, such as an oval shape (i.e., the same first shape) and approximately the same width (i.e., the same first width). As discussed above, the multi-layer spacer is formed and, then, during the second etch process and optional substrate pull back process, the substrate can be etched such that portions of the third section of the trench in the substrate have different shapes and optionally different widths at different depths. That is, during the second etch and pull back processes, the sidewalls of the upper portion of the third section of the trench are protected by the spacer and the exposed substrate is etched and optionally pulled back so that a mid-portion of the third section of the trench has a second shape that is different from and wider than the first shape (e.g., a rectangle or octagon shape). The substrate can also be etched and pulled back so that a lower portion of the third section of the trench has a third shape that is different from and wider than the first shape and that is either the same or different from the second shape (e.g., a rectangle shape).

In another exemplary embodiment of the method, during the first etch process, the semiconductor layer, the insulator layer and the top surface of the substrate are similarly etched. However, in this embodiment, rather than pulling back the sidewalls of the first section of the trench and of the upper portion of the third section of the trench by performing an isotropic etch process, an anisotropic etch process is performed (e.g., a wet etch using an etchant containing ammonium hydroxide). Thus, the first section of the deep trench in the semiconductor layer and the over-etched upper portion of the third section of the trench in the substrate will have a first shape (e.g., a rectangle shape) and the second section of the deep trench in the insulator layer will have a second shape (e.g., an oval shape) that is different from the first shape.

Then, as with the previously described embodiment, the multi-layer spacer is formed and during the second etch process and optional substrate pull back process, the substrate can be etched such that portions of the third section of the deep trench have different shapes and optionally different widths at different depths. That is, during the second etch and pull back processes, the sidewalls of the upper portion of the third section of the trench are protected by the multi-layer spacer and the substrate can be etched so that a mid-portion of the third section of the trench in the substrate has a third shape (e.g., a rectangle or octagon shape) that is different from the second shape and either the same or different from the first shape. The substrate can further be etched so that a lower portion of the third section of the trench has the same first shape (e.g., a rectangle shape) as the first section and the upper portion of the third section.

Once the deep trench is formed, a capacitor can be formed in the substrate. Specifically, if the substrate is not already heavily doped with an n-type or p-type dopant to form a first conductive plate, the region of the substrate adjacent to the third section can be doped (e.g., with an n-type or p-type dopant) so as to form the first conductive plate (i.e., a buried plate). This, doping process can be performed either before or after the optional process during which the exposed substrate is pulled back to adjust the width of the third section. Then, the deep trench can be lined with a dielectric liner and filled with a conductive fill material to form a second conductive plate in the third section of the deep trench.

A transistor can also be formed adjacent to the capacitor so as to form a memory device (e.g., an embedded dynamic random access memory (DRAM) device). Specifically, a transistor can be formed such that a source/drain region of the transistor is positioned in the semiconductor layer adjacent to the first section of the deep trench and is electrically connected to the capacitor in the third section via a conductive strap (i.e., the conductive fill material in the first section and the second section of the deep trench). Additionally, if the first section of the deep trench is formed with a shape other than an oval shape (e.g., a rectangular shape with corners, see the second structure embodiment discussed above) the source/drain region can be formed such that it conforms to one of the corners of the rectangular shaped first section so as to maximize the surface area contact between the conductive strap and the source/drain region and, thereby, to minimize the resistance between the transistor and the capacitor.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 2a and 2b are cross-sectional and plan view schematic diagrams illustrating an embodiment of a deep trench structure of the invention;

FIGS. 13a and 13b are cross-sectional and plan view schematic diagrams illustrating a partially completed deep trench structure as in FIGS. 3a and 3b.

DETAILED DESCRIPTION OF PREFERRED EMBODIMENTS

Figure 1:
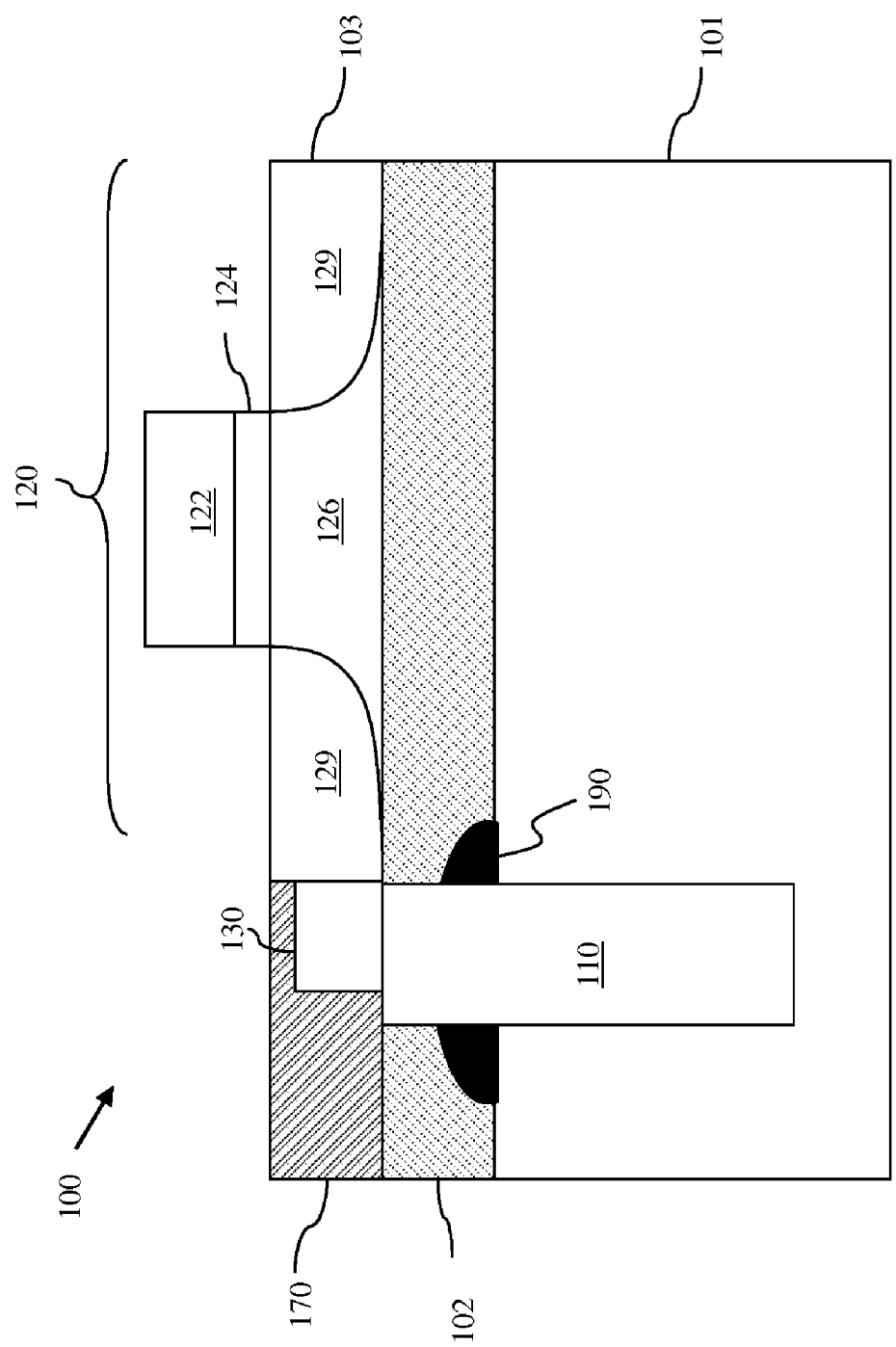
FIG. 1 is a schematic diagram illustrating an embedded dynamic random access memory device.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, embedded dynamic random access memory (eDRAM) technology has played an important role in the emerging system-on-chip (SoC) products. Referring to FIG. 1, an eDRAM cell 100 typically comprises a deep trench capacitor 110 connected, for example, by a conductive strap 130 buried within a shallow trench isolation region 170, to a source/drain region 129 of a pass transistor 120 (i.e., a pass gate transistor, an access transistor, etc.) which further comprises a channel region 126, a gate dielectric 124, and a gate conductor 122. The capacitor 110 stores a charge and the transistor 120 transfers the charge via the strap 130 to and from the capacitor 110. The absence or presence of a charge in the storage capacitor 110 represents a bit of data.

Significant system performance gains have been demonstrated by integrating eDRAM and logic units on the same chip. Given the enormous success of eDRAM technology achieved on bulk silicon substrates, integrating eDRAM with semiconductor-on-insulator (SOI) technology will further boost the performance of high-end SOI server chips. However, the development of SOI eDRAM technology imposes significant challenges. Specifically, early attempts to develop this technology failed to produce robust SOI eDRAM chips due to a severe undercut 190 of the buried oxide (BOX) layer 102 under the silicon layer 103 of the SOI wafer. This undercut 190 of the BOX layer 102 results in shorts between neighboring devices and/or device reliability concerns.

U.S. Pat. No. 6,566,177 entitled "Silicon-on-insulator vertical array device trench capacitor DRAM" to Radens et al. on May 20, 2003 (incorporated herein by reference) teaches a method to protect the BOX layer by forming a nitride sidewall spacer on the initial trench sidewalls before the deep trench is etched. However, this nitride spacer may break during the deep trench etch because there is a limitation on the nitride spacer thickness and because of limited etch selectivity between silicon and nitrides. Specifically, increasing the nitride spacer thickness reduces the chance of broken spacer in the subsequent deep trench reactive ion etch (RIE), but this will effectively reduce the size of the trench opening. Narrowing the trench is undesired as it imposes increased challenges on deep trench RIE. It also reduces the trench depth and, thus, causes a reduction in the trench capacitance. As trench sizes are downscaled to 150 nm and below, increasing nitride spacer thickness becomes prohibitively impractical, if not impossible. Typically, the limit of nitride spacer thickness is about 15 nanometers (nm). On the other hand, the trench depth is usually several micron meters (um). Such a high aspect ratio (i.e., the ratio between the depth of the deep trench and the thickness of the nitride spacer) implies that an etch selectivity between silicon and nitride would have to be high enough in order to preserve the nitride spacer during deep trench etch. Unfortunately, a high selectivity is difficult to achieve with current technology. In summary, the thin nitride spacer as well as the limited etch selectivity between silicon and nitrides, makes it difficult for the nitride spacer to survive the deep trench etch. Consequently, severe undercutting of the BOX layer may occur as a result of a broken nitride spacer.

In view of the foregoing, disclosed herein are embodiments of an improved deep trench capacitor structure and a memory device (e.g., a dynamic random access memory (DRAM) or an embedded DRAM (eDRAM)) that incorporates this deep trench capacitor structure. The deep trench capacitor and memory device embodiments are formed on a semiconductor-on-insulator (SOI) wafer such that the insulator layer remains intact following a deep trench etch process and, optionally, such that the deep trench of the deep trench capacitor has different shapes and sizes at different depths. By forming the deep trench with different shapes and sizes at different depths the capacitance of the capacitor can be selectively varied and the resistance of the conductive strap which connects the capacitor to a another device (e.g., to a transistor in a memory device, such as a pass transistor in a DRAM or eDRAM device) can be reduced.

Also disclosed are embodiments of a method of forming the deep trench capacitor and the memory device that incorporates this deep trench capacitor. Specifically, during the deep trench capacitor formation process, the insulator layer of a semiconductor-on-insulator (SOI) wafer is protected by a spacer (e.g., a nitride spacer). However, by pulling back both the SOI and insulator layers prior to forming the spacer an overhang in a pad layer is created. This overhang prevents the subsequently formed spacer from being bombarded by plasma and ions and breaking during a deep trench reactive ion etch (RIE) process. The spacer can further be protected by forming a thin protection layer on the top surface of the spacer prior to the RIE process, thereby, forming a multi-layer spacer. Since the protection layer has much greater resistance to the deep trench RIE process, the underlying spacer remains intact. Additionally, the processes used to etch each layer of the SOI wafer can be selectively varied so as to selectively vary the size and shape of the trench within the different layers and at different depths so as to selectively vary the capacitance of the trench capacitor as well as the resistance of the buried conductive strap which connects the deep trench capacitor to another device (e.g., to a transistor in a memory device, such as a pass transistor in a DRAM or eDRAM device).

Figure 3B:
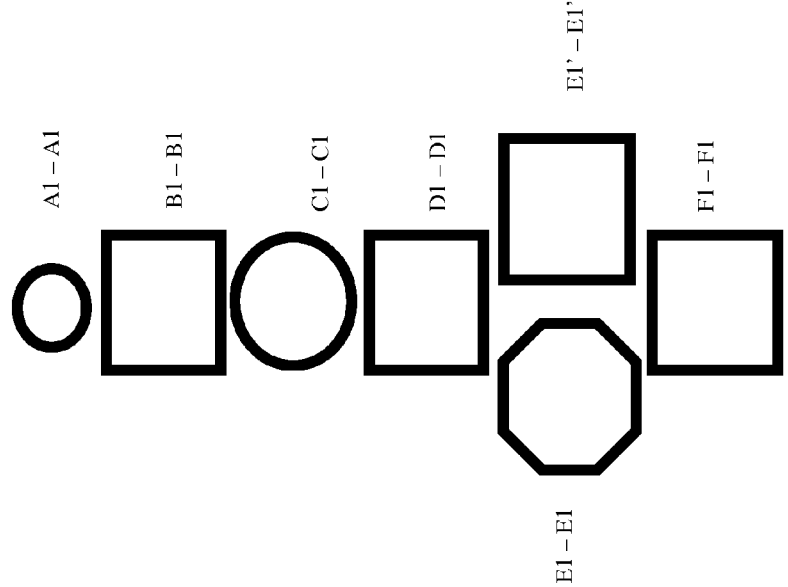
FIGS. 3a and 3b are cross-sectional and plan view schematic diagrams illustrating another embodiment of a deep trench structure of the invention.
Figure 3A:
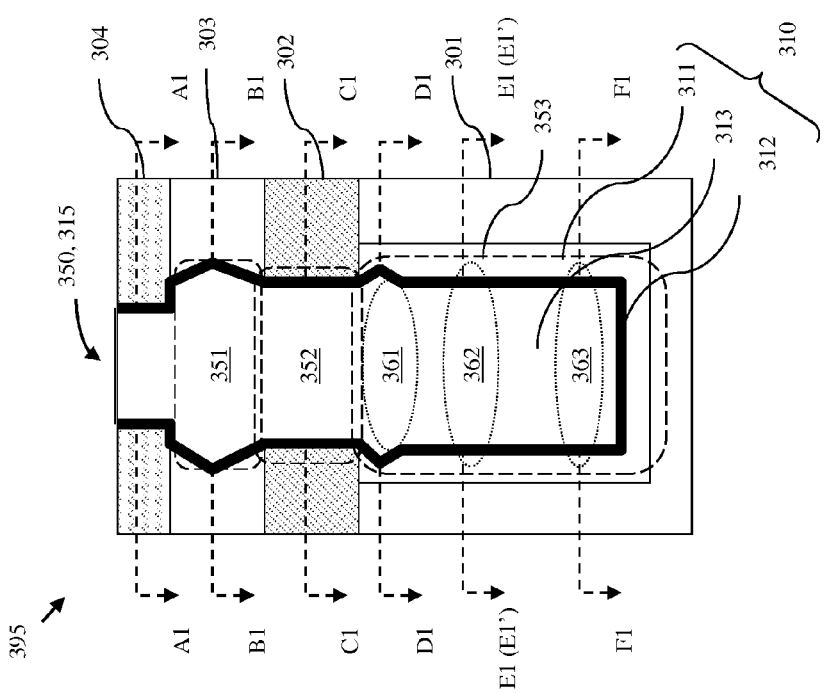

More particularly, referring to FIGS. 2a and 3a, disclosed herein are several embodiments of a semiconductor device 295, 395 that comprises a deep trench 250, 350. Specifically, the structure can comprise a semiconductor-on-insulator (SOI) structure (e.g., an SOI wafer) comprising a semiconductor layer 203, 303, an insulator layer 202, 302 below the semiconductor layer 203, 303 and a semiconductor substrate 201, 301 below the insulator layer 202, 302.

The semiconductor layer 203, 303 and the substrate 201, 301 can comprise one or more semiconductor materials, including but not limited to silicon, germanium, silicon germanium, silicon carbide, those materials consisting essentially III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity), and those materials consisting essentially of one or more II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Additionally, a portion of or the entire semiconductor layer 203, 303 and the substrate 201, 301 may be amorphous, polycrystalline, or single-crystalline. A portion of or the entire semiconductor layer 203, 303 and the substrate 201, 301 may be strained. Finally, the semiconductor layer 203, 303 and the substrate 201, 301 may comprise the same or different materials and may have the same or different crystallographic orientations.

The insulator layer 202, 302 can comprise one or more dielectric materials, including but not limited to, silicon oxide, silicon nitride, silicon oxynitride, and a suitable high-k material. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

In one embodiment, the semiconductor-on-insulator structure can comprise a silicon-on-insulator wafer with the semiconductor layer 203, 303, and the substrate 201, 301 comprising silicon and the insulator layer 202, 302 comprising a buried silicon oxide (BOX) layer.

The deep trench 250, 350 may comprise at least three different sections 251-253, 351-353 and can be filled with a conductive fill material 215, 315. The conductive fill material 215, 315 can, for example, comprise a polycrystalline or amorphous silicon, germanium, silicon germanium, a metal (e.g., tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), or any suitable combination of these materials. The conductive fill material 215, 315 can further be doped with a p-type dopant (e.g., boron (B), gallium (Ga), indium (In), and/or thallium (Tl)) or heavily doped with an n-type dopant (e.g., phosphorus (P), arsenic (As) and/or antimony (Sb)).

A first section 251, 351 of the deep trench 250, 350 can extend through the semiconductor layer 203, 303. A second section 252, 352 of the deep trench 250, 350 can extend through the insulator layer 202, 302. A third section 253, 353 of the deep trench 250, 350 can extend into the substrate 201, 301. The different sections 251-253, 351-353 as well as different portions 261-263, 361-363 of the third section 253, 353 can have different shapes and/or different widths at different depths.

For example, referring in combination to the cross-sectional and plan views of semiconductor structure 295 in FIGS. 2a and 2b, respectively, in one embodiment the first section 251, the second section 252 and an upper portion 261 (i.e., a first portion) of the third section 253 of the deep trench 250 adjacent to the insulator layer 202 can all have the same shape, (i.e., the same first shape). Specifically, they can each have an oval shape (see shapes B1-B1, C1-C1 and D1-D1). A mid-portion 262 (i.e., a second portion) of the third section 253 below the upper portion 261 can have a second shape that is different from the first shape. Specifically, the mid-portion 262 can have an octagon shape (see shape E1-E1) or a rectangle (see shape E1'-E1'). A lower portion 263 (i.e., a third portion) of the third section 253 below the mid-portion 262 can have a third shape that is different from the first shape and either the same or different from the second shape. Specifically, the lower portion 263 can have a rectangle shape (see shape F1-F1).

In this embodiment, each of the sections 251-253 can have approximately the same width. However, the width of the deep trench can also vary between the sections and between different portions within the sections. For example, the entire third section 253 can be wider or narrower than the first and second sections 251-252. Alternatively, as illustrated in FIGS. 2a-2b, the first section 251, the second section 252 and the upper portion 261 (i.e., first portion) of the third section 253 can each have approximately the same width 281 (i.e., the same first width) and the mid and lower portions 262-263 (i.e., second and third portions) of the third section 253 of the deep trench 250 can be wider (i.e., have the same second width 282 that is greater than the first width 281) (as shown) or narrower (i.e., have the same second width 282 that is less than the first width 281).

Referring in combination to the cross-sectional and plan view of the semiconductor structure 395 in FIGS. 3a and 3b, respectively, in another embodiment, the first section 351 and, optionally, an upper portion 361 (i.e., a first portion) of the third section 353 adjacent to the insulator layer 302 can each have approximately the same shape (i.e., a first shape). Specifically, the first shape can be a rectangle shape (see shapes B1-B1 and D1-D1). The second section 352 can have a second shape that is different from the first shape. Specifically, the second shape can be an oval shape (see shape C1-C1). Additionally, a mid-portion 362 (i.e., a second portion) of the third section 353 below the upper portion 361 can have a third shape that is different from the second shape and either the same or different from the first shape. Specifically, this third shape can be an octagon shape (see shape E1-E1) or a rectangle (see shape E1'-E1'). A lower portion 363 (i.e., a third portion) of the third section 353 below the mid-portion 362 can have the same (rectangular) shape as the first section 351. Finally, the lower portion 363 (i.e., the third portion) of the third section 353 below the mid-portion 362 can have the same shape as or different shape from the mid-portion 362 of the third section 353.

As with the previously described embodiment, in this embodiment, each of the sections 351-353 can have approximately the same width (e.g., as illustrated in FIGS. 3a-3b). However, the width of the deep trench can also vary between the sections and between different portions within the sections. For example, the entire third section 353 can be wider or narrower than the first and second sections 351-352. Alternatively, the first section 351, the second section 352 and the upper portion 361 (i.e., first portion) of the third section 353 can each have approximately the same width (i.e., the same first width) and the mid and lower portions 362-363 (i.e., second and third portions) of the third section 353 of the deep trench 350 can be narrower or wider, depending on processes and applications.

Referring again to FIGS. 2a and 3a, in both embodiments the semiconductor device 295, 395 can comprise a capacitor 210, 310 in the substrate 201, 301 and, particularly, this capacitor 210, 310 is formed using the third section 253, 353 of the deep trench 250, 350. Specifically, this capacitor 210, 310 can comprise a node dielectric liner 212, 312 lining the deep trench 250, 350, a first conductive plate 211, 311 comprising either the substrate 201, 301 heavily doped with an n-type or p-type dopant or a buried plate within the substrate (i.e., a conductive region in the substrate adjacent to the third section of the deep trench, such as a highly doped n-type or p-type doped region within the silicon substrate 201, 301 surrounding the third section 253, 353 of the deep trench 250, 350), and a second conductive plate 213, 313 comprising the conductive fill material 215, 315 within the third section 253, 353 of the deep trench 250, 350.

By varying the shapes and widths of the different sections of the deep trench at different depths, the capacitance of the capacitor can be selectively varied. Specifically, by forming at least the mid and lower portions 262-263, 362-363 of the third section 253, 353 of the deep trench wider than the first and second sections 251-252, 351-352 of the deep trench, the capacitance of the capacitor 210, 310 can be increased without encroaching upon additional devices formed in the semiconductor layer 203, 303.

Figure 4:
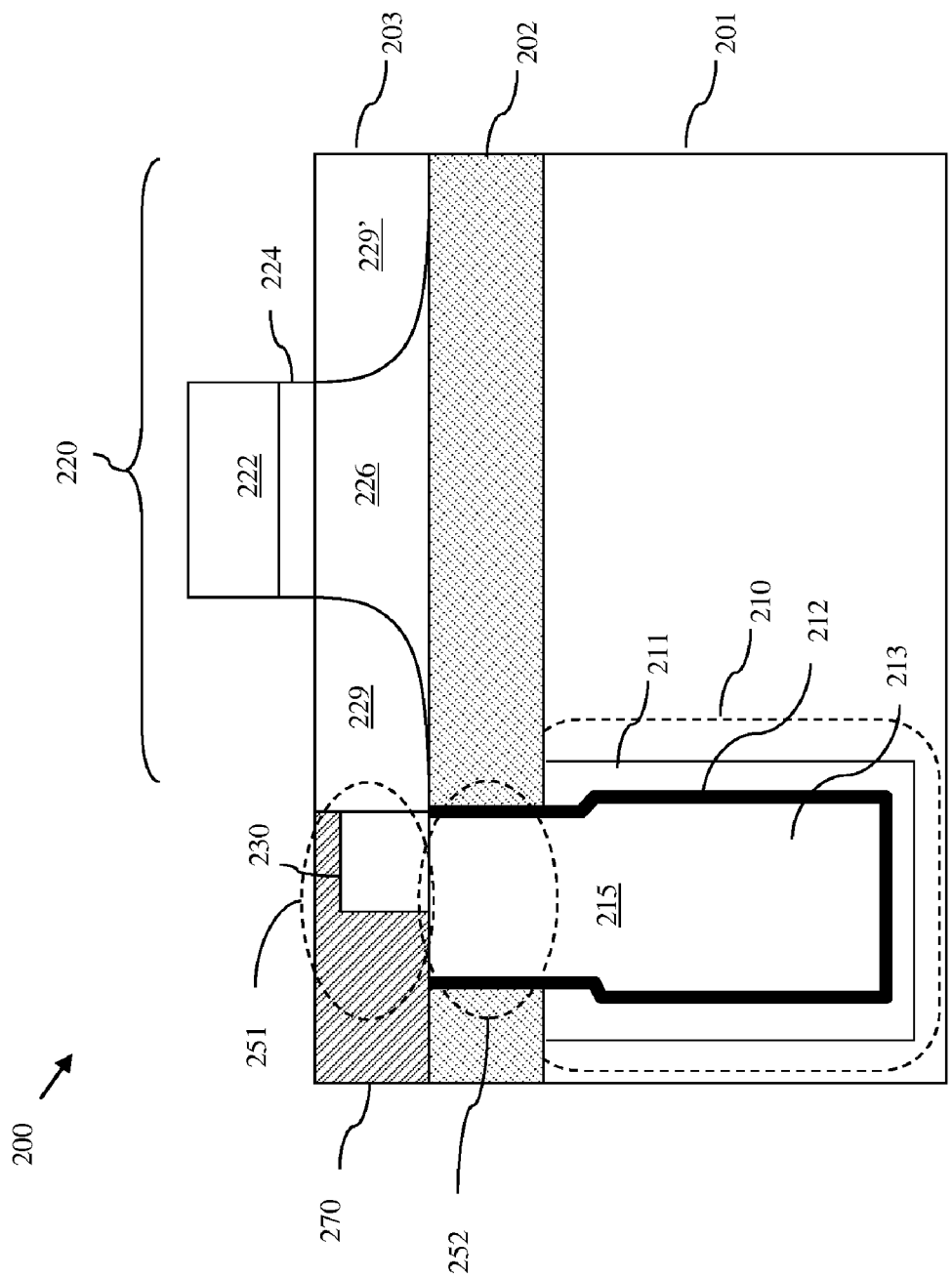
FIG. 4 is a schematic diagram illustrating an embodiment of a memory device of the invention.
Figure 5:
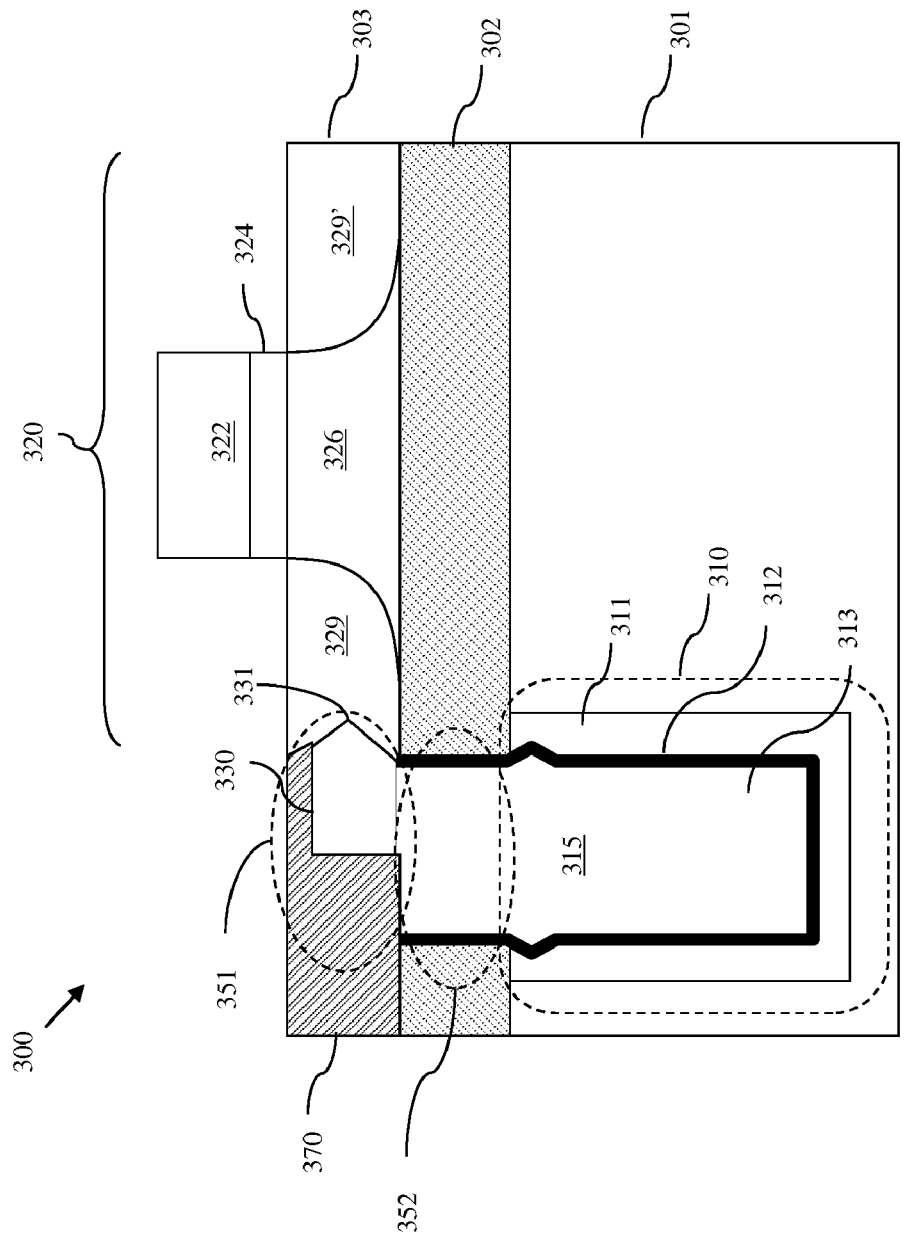
FIG. 5 is a schematic diagram illustrating an embodiment of another memory device of the invention.

The semiconductor device 295, 395 can further be incorporated into a memory device, such as an embedded dynamic access memory (eDRAM) device 200 (see FIG. 4) or 300 (see FIG. 5). This memory device 200, 300 can comprise a transistor 220, 320 (e.g., a metal oxide semiconductor field effect transistor) formed on the same wafer and electrically connected to the capacitor 210, 310. Specifically, the memory device 200, 300 can comprise a transistor 220, 320 comprising a source/drain region 229 and 229', 329 and 329' in the semiconductor layer 203, 303, a channel region 226, 326, a gate dielectric 224, 324, and a gate conductor 222, and 322. The source/drain region 229 and 329 is adjacent to the first section 251, 351 of the deep trench and electrically connected to the capacitor 210, 310 via a conductive strap 230, 330 (i.e., the conductive fill material 215, 315 in the first section 251, 351 and the second section 252, 352 of the deep trench).

It should be noted that this conductive strap 230, 330 can be buried during memory device 200, 300 formation by the formation of a shallow trench isolation region 270, 370 in the semiconductor layer 303 and, particularly, within a top portion of the first section 251, 351.

Additionally, as illustrated in FIG. 5, if the first section 351 of the deep trench comprises a shape other than an oval shape (e.g., a rectangular shape with corners, see B1-B1 of FIGS. 3a-3b) as in semiconductor structure 395, the source/drain region 329 can conform to one of the corners 331 of the rectangular first section to maximize the surface area contact between the conductive strap 330 and the source/drain region 329 and, thereby, to minimize the resistance between the transistor 320 and the capacitor 310.

Figure 6:
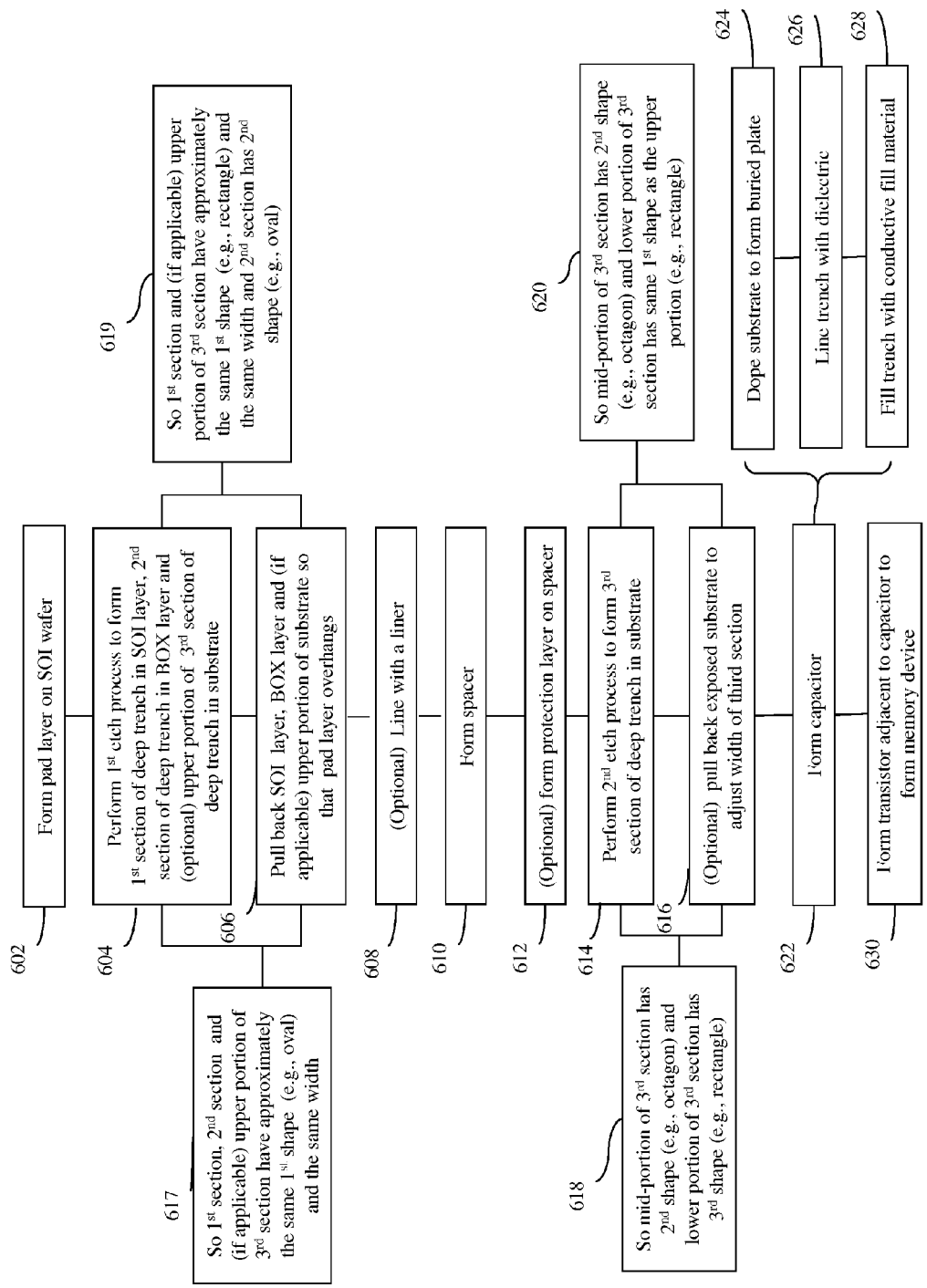
FIG. 6 is a flow diagram illustrating the method embodiments of the invention.
Figure 7:
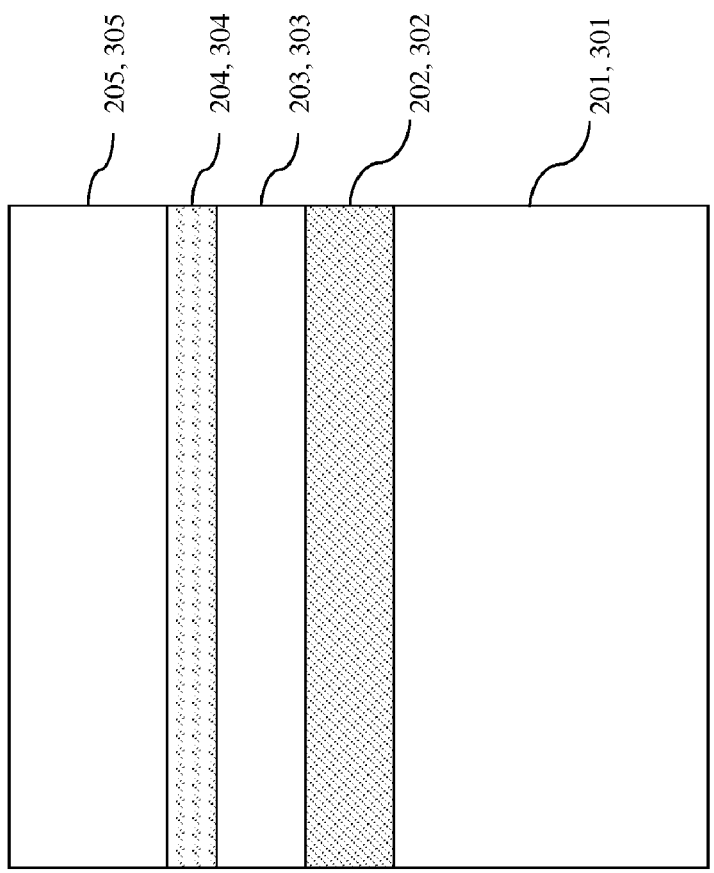
FIG. 7 is a schematic diagram illustrating a partially completed deep trench structure.

Referring to FIG. 6, also disclosed are embodiments of methods of forming the semiconductor structure described above. Referring to 602 in FIG. 6, the method embodiments each comprise providing a structure, such as a semiconductor-on-insulator (SOI) wafer, with a semiconductor layer 203, 303 on an insulator layer 202, 302 on a substrate 201, 301. Then, a pad layer 204, 304, comprising, for example, an optional pad oxide layer and a pad nitride layer, is formed on the semiconductor layer 203, 303 and a hard mask layer 205, 305 (e.g., another oxide layer) is formed on the pad nitride layer (see FIG. 7).

The semiconductor layer 203, 303 and the substrate 201, 301 of the wafer structure provided can each comprise one or more semiconductor materials, including but not limited to silicon, germanium, silicon germanium, silicon carbide, those materials consisting essentially III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity), and those materials consisting essentially of one or more II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Additionally, a portion of or the entire semiconductor layer 203, 303 and the substrate 201, 301 may be amorphous, polycrystalline, or single-crystalline. A portion of or the entire semiconductor layer 203, 303 and the substrate 201, 301 may be strained. Finally, the semiconductor layer 203, 303 and the substrate 201, 301 may comprise the same or different materials and may have the same or different crystallographic orientations.

The insulator layer 202, 302 of the wafer structure provided can comprise one or more dielectric materials, including but not limited to, silicon oxide, silicon nitride, silicon oxynitride, and a high-k material. Examples of suitable high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

In one embodiment, the semiconductor-on-insulator structure can comprise a silicon-on-insulator wafer with the semiconductor layer 203, 303, and the substrate 201, 301 comprising a silicon and the insulator layer 202, 302 comprising a buried silicon oxide (BOX) layer.

Figure 8:
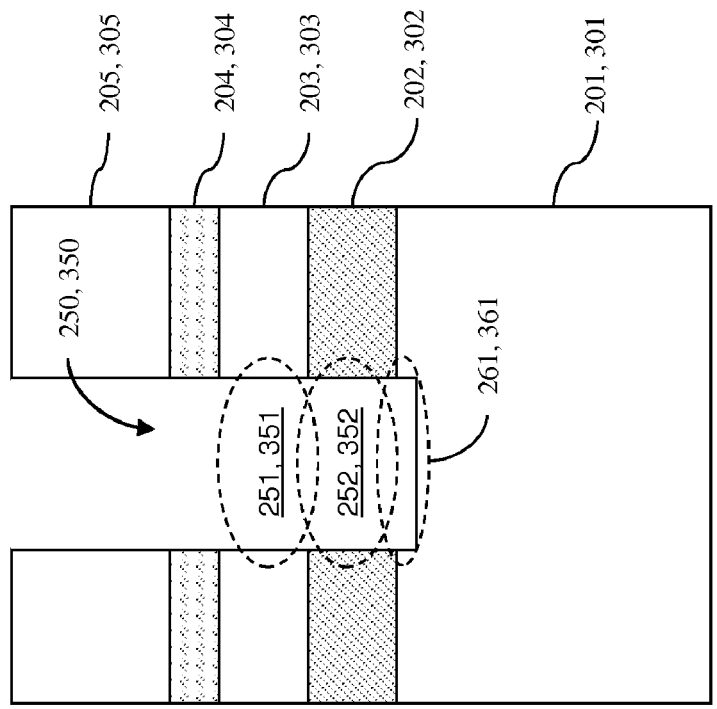
FIG. 8 is a schematic diagram illustrating a partially completed deep trench structure.

Next, referring to 604 in FIG. 6, a first etch process can be performed which entails etching through the hard mask layer 205, 305, through the pad layer 204, 304, through the semiconductor layer 203, 303 and through the insulator layer 202, 302 to expose the substrate 201, 301 (see FIG. 8). This first etch process can be accomplished using any patterning technique (e.g., conventional lithography) and etching technique (e.g., selective reactive ion etch (RIE) in which the etch is directional (i.e., approximately normal to the substrate)). Optionally, during this first etch process 604, the top surface of the substrate 201, 301 just below the insulator layer 202, 302 can also be etched. Thus, performing this first etch process forms a first section 251, 351 of a deep trench 250, 350 in the semiconductor layer 203, 303, a second section 252, 352 of the deep trench 250, 350 in the insulator layer 202, 302 and, if applicable, an upper portion 261, 361 (i.e., a first portion) of a third section 253, 353 of the deep trench 250, 350 in the substrate 201, 301. Depending on the etch conditions of the first etch process, the sidewalls of the trench can be vertical (i.e., the first section of the trench in the semiconductor layer and the second section of the trench in the insulator have substantially the same width) or slightly tapered (i.e., the width of the trench gradually decreases from the first section of the trench to the second section of the trench).

Then, referring to 606 in FIG. 6, the sidewalls of the first section of the trench in the semiconductor layer and the second section of the trench in the insulator layer can be pulled back (i.e., are etched parallel to the substrate surface to remove portions of the semiconductor layer and insulator layer and, thereby, widen the first and second sections of the trench). That is, portions of the semiconductor layer within the first section of the trench are removed (i.e., etched approximately parallel to the substrate) and portions of the insulator layer within the second section of the trench are removed (i.e., etched approximately parallel to the substrate) such that the edges of the pad layer overhang the first section and the second section. Specifically, by pulling back the sidewalls an overhang in the pad nitride layer is created. This overhang prevents the subsequently formed spacer (see discussion below) and thus, the insulator layer from being damaged as a result of a subsequent second etch process (i.e., a deep trench etch process, see discussion of process 614 below). Additionally, if the top surface of the substrate was over-etched during the first etch process to form the upper portion of the third section of the trench in the substrate, then the sidewalls of the upper portion of the third section of the trench can also be pulled back at process 606 simultaneous with the pulling back of the semiconductor layer (i.e., etched parallel to the substrate surface to remove portions of the substrate and widen this upper portion of the third section of the trench) to further ensure that the insulator layer is protected by the spacer during the second etch process.

After the pull back processes 606 are performed, the first and second sections (and, if applicable, referring to 608 in FIG. 6, the upper portion of the third section) of the deep trench can optionally be lined with a liner (e.g., an oxide or nitride liner) so as to improve adhesion and release stress between the semiconductor layer (e.g., a silicon layer) a subsequently formed spacer (e.g., a nitride spacer, see discussion of process 610 below). Then, the spacer (e.g., a nitride spacer) is formed on sidewalls of the first section, the second section, and, if applicable, any exposed sidewalls within the substrate (e.g., if the top surface of the substrate is etched during the first etch process) (process 610 in FIG. 6). To further ensure the protection of the spacer and, thus, the insulator layer, during the subsequent second etch process (i.e., a deep trench etch process, see discussion of process 614 below), a spacer protection layer can be formed on the spacer, thereby, forming a multi-layer spacer (process 612 in FIG. 6). This spacer protection layer can comprise a dielectric material (e.g., an oxide) with a substantially higher etch resistance than the material (e.g., the nitride) that is used to form the spacer.

More specifically, to form the multi-layer spacer at processes 610-612, the spacer, preferably comprising a nitride material, and the optional underlying liner, preferably comprising an oxide or nitride material, can be formed by any conventional technique, including but not limited to, oxidation, nitridation, chemical vapor deposition (CVD), low-pressure CVD (LPCVD), plasma-assisted CVD (PECVD), ozone Tetraethyl Orthosilicate (TEOS) deposition, atomic-layer deposition (ALD), rapid thermal deposition (RTP). The thickness of the nitride material can be approximately 2 nm to 20 nm and more preferably approximately 10-15 nm. The optional underlying oxide liner, if present, can have a thickness of approximately 2-20 nm and more preferably approximately 2-5 nm.

The spacer protection layer, which has a substantially higher etch resistance than the underlying spacer material, can comprise one or more materials, including but not limited to, oxide (e.g., silicon oxide), a metal (e.g., tungsten, titanium, tantalum, ruthenium, cobalt, copper, aluminum, lead, platinum, tin, silver, gold), a metallic compound material (e.g., tantalum nitride, titanium nitride, tungsten silicide, tungsten nitride, titanium nitride, tantalum nitride, cobalt silicide, nickel silicide). The spacer protection layer can be formed by any suitable technique, including but not limited to, atomic layer deposition (ALD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), high temperature oxide deposition (HTO), low temperature oxide deposition (LTO), limited reaction processing CVD (LRPCVD), ultra-high vacuum chemical vapor deposition (UHVCVD), metalorganic chemical vapor deposition (MOCVD), physical vapor deposition, sputtering, plating, evaporation, ion beam deposition, electron beam deposition, and laser assisted deposition.

As mentioned above, the spacer protection layer can comprise a silicon oxide material. Specifically, an oxide spacer protection layer can be formed by conventional deposition techniques such as chemical vapor deposition (LPCVD), atomic layer deposition (ALD), high temperature oxide deposition (HTO), or low temperature oxide deposition (LTO). Alternatively, an oxide spacer protection layer can be formed by converting a portion (i.e., an exposed surface of the underlying nitride spacer into an oxide. This can be accomplished by oxidation such as in-situ steam generation (ISSG), radical-based oxidation, wet oxidation, dry oxidation. Finally, the oxide spacer protection layer can also be formed by first depositing an amorphous or polycrystalline silicon on the nitride layer and then converting the silicon layer into silicon oxide by oxidation.

The spacer protection layer, the spacer layer, and the optional liner can then be etched to formed the multi-layer spacer covering the sidewalls of the first section 251 of the trench in the semiconductor-on-insulator (SOI) layer (i.e., the semiconductor layer 203), of the second section 251 of the trench in the buried oxide (BOX) layer (i.e., the insulator layer 202) and, if applicable, of the upper portion 261 of the third section 253 of the trench in the substrate 201.

Next, referring to process 614 in FIG. 6, a second etch process can be performed. This second etch process can comprise etching vertically into the substrate (i.e., approximately normal to the substrate) such that the spacer remains intact and the third section of the deep trench is completely formed in the substrate below the second section. That is, if the upper portion of the third section of the trench was not etched during the first etch process, then upper, mid and lower portions (i.e., first, second and third portions, respectively) of the third section of the trench are etched into the substrate. Alternatively, if the upper portion of the third section of the trench was formed during the first etch process, then a mid-portion (i.e., second portion) of the third section of the deep trench is etched below the upper portion and a lower portion (i.e., a third portion) is etched below the mid-portion. This second etch process 614 can be accomplished using conventional processes, such as a reactive ion etch (RIE) processes. Depending on the etch conditions, the width of the third section of the trench created by the second etch process is approximately the same or varies along the depth of the third section of the trench.

Optionally, after the second etch process is performed at process 614, the sidewalls of the exposed substrate can be pulled back to vary the width of the third section of the deep trench (process 616). That is, some of the substrate in the third section can be removed (i.e., etched approximately parallel to the substrate) to widen the trench.

During the second etch process 614 and the optional pull back process 616, all or some of the spacer protection layer of the multi-layer spacer may be consumed. However, good etch selectivity between the oxide of the spacer protection layer and the silicon of the substrate coupled with the overhang in the pad layer 204 ensures that the underlying nitride spacer remains intact after the deep trench 250 is completely formed at processes 614-616. Consequently, depending upon the various etch processes and pull back processes that are performed, the different sections of the deep trench (i.e., the first, second and third sections) as well as different portions (i.e., the upper, mid and lower portions) of the third section can have different shapes and/or different widths at different depths.

For example, in one embodiment of the method the hard mask layer 205, the pad layer 204, the semiconductor layer 203, the insulator layer 202 and the top surface of the substrate 201 are all etched approximately normal to the substrate during the first etch process (604 in FIG. 6 and FIG. 8). As mentioned above, this step 604 can be accomplished using conventional lithographic and selective RIE techniques. Then, the sidewalls of first section 251 of the trench 250 in the semiconductor layer 203, of the second section 252 of the trench 250 in the insulator layer 202 and of the upper portion 261 of the third section 253 of the trench 250 in the substrate 201 are all pulled back (i.e., etched approximately parallel to the substrate to remove portions of the semiconductor layer, insulator layer and substrate and, thereby, widen the first section, second section and upper portion of the third section of the trench) so that they have approximately the same first shape and approximately the same first width (617 in FIG. 6).

Figures 9A, 9B:
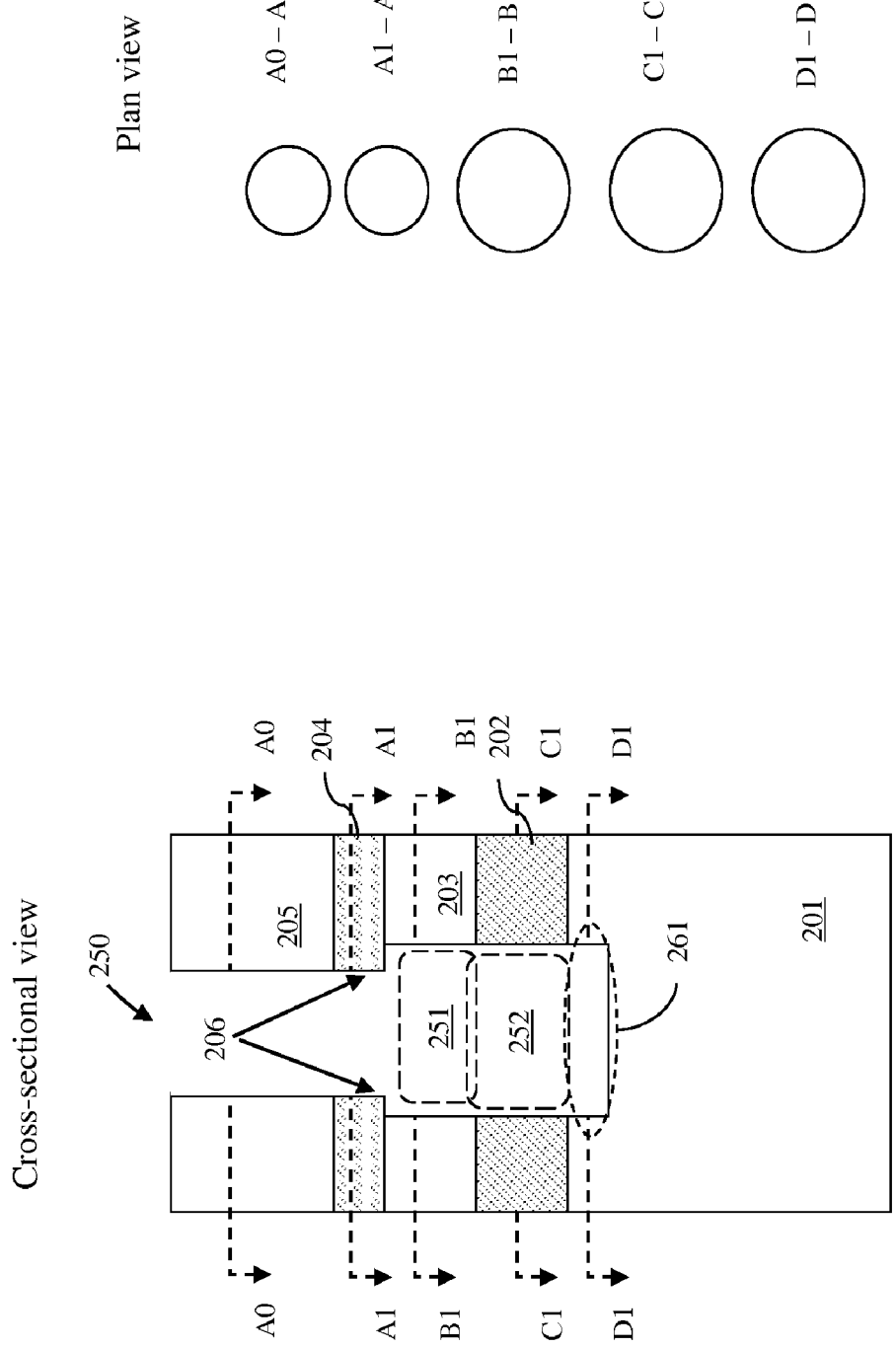
FIGS. 9a and 9b are cross-sectional and plan view schematic diagrams illustrating a partially completed deep trench structure as in FIGS. 2a and 2b.

Specifically, as illustrated in the cross-sectional and plan views, respectively, of FIGS. 9a and 9b, the shape of the trench 250 following the first etch process 604 through the hard mask layer 205, through the pad layer 204, through the semiconductor layer 203, through the insulator layer 202 and into the upper portion 261 of the substrate 201 will be an oval shape (see shapes A0-A0, A1-A1, B1-B1, C1-C1 and D1-D1). This oval shape can be maintained by using isotropic pull back processes. That is, isotropic etch processes can be used to pull back the sidewalls of the various sections so that the shape of the trench remains an oval in the first section 251 in the semiconductor layer 203, in the second section 252 in the insulator layer 202 and in the upper portion 261 of the third section 253 in the substrate 261 (see shapes B1-B1, C1-C1 and D1-D1). Additionally, the isotropic pull back processes can be performed such that the widths of shapes B1-B1, C1-C1 and D1-D1 stay the same and such that the sidewalls of shapes B1-B1, C1-C1 and D1-D1 remain aligned. Thus, the width of the trench in the pad nitride layer 204 (see A1-A1) will be less than the width of the trench in the sections 251, 252, 253 below and, furthermore, the edge 206 of the pad layer 204 will provide a protective overhang.

More specifically, during process 617, the sidewalls of the first section 251 of the trench 250 in the SOI layer (i.e., the semiconductor layer 203) and the sidewalls of the upper portion 261 of the third section 253 of the trench 250 in the silicon substrate 201 can be simultaneously pulled back (i.e., etched approximately parallel to the substrate to remove portions of the SOI layer and substrate and thereby widen the first section and upper portion of the third section of the trench) by a wet silicon etch process with an etchant containing nitric hydrofluoric acid. Alternatively, a plasma etch or chemical downstream etch (CDE) can be used for this pull back.

The sidewalls of the second section 252 of the trench 250 in the buried oxide (BOX) layer (i.e., the insulator layer 202) can be pulled back (i.e., etched approximately parallel to the substrate to remove portions of the insulator layer and thereby widen the second section of the trench) using a conventional wet oxide etch process with an etchant that contains hydrofluoric acid (HF), such as a buffered hydrofluoric acid (BHF) or a diluted hydrofluoric acid (DHF). Alternatively, the BOX layer 202 can be pulled back (i.e., etched approximately parallel to the substrate) using a dry etch process such as plasma etch or dry chemical oxide removal.

Pull back of the sidewalls of the second section 252 of the trench in the BOX layer 202 and the pull back of the sidewalls of the first section 251 of the trench in the SOI layer 203 and of sidewalls of the upper portion 261 of the third section 253 of the trench can be completed in two separate processes. Alternatively, the pull back of the sidewalls of the second section 252 and the pull back of the first section 251 and the upper portion 261 of the second section can be completed in an integrated process comprising two steps. For example, an integrated process can be used that comprises a BHF etch followed by a nitric hydrofluoric acid etch or, alternatively, a nitric hydrofluoric acid etch followed by a BHF etch. By isotropically pulling back the BOX layer 202 and the SOI layer 203 (and the over-etched upper portion 261 of the third section 253 in the substrate 201), the trench is wider below the pad nitride layer 204, but the shape remains the same. Preferably, the sidewalls of the second section 252 in the BOX layer 202, the first section 251 in the SOI layer 203 and the upper portion 261 of the third section 253 in the substrate 201 are all pulled back (i.e., etched approximately parallel to the substrate) approximately the same amount so that the sidewalls in the first section 251 of the deep trench 250, second section 252 of the deep trench 250 and the upper portion 261 of the third section 253 of the deep trench 250 are aligned.

Figure 10:
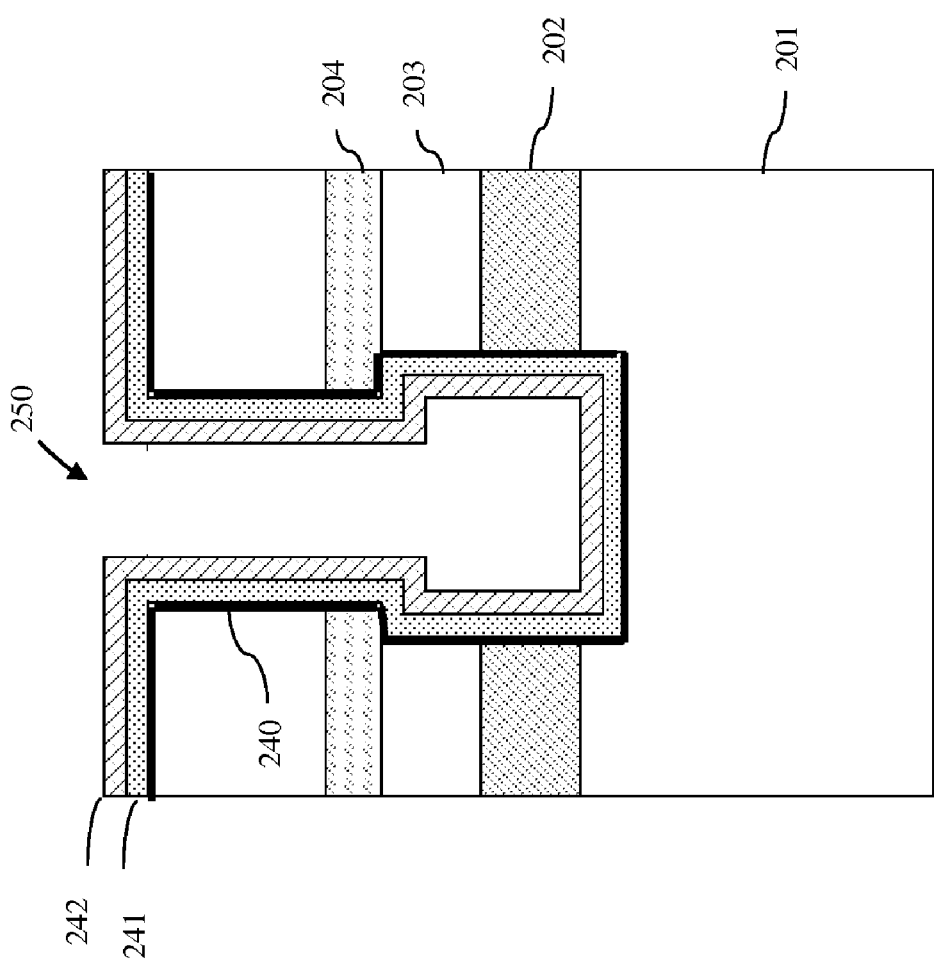
FIG. 10 is a schematic diagram illustrating a partially completed deep trench structure.

Referring to FIG. 10, after the first etch process 604, an optional liner 240 can be formed (e.g., an oxide or nitride liner) followed by forming a spacer 241 (e.g., a nitride spacer layer) and a spacer protection layer 242 (e.g., an oxide spacer protection layer) as discussed above with regard to steps 608-612. In one embodiment, the optional liner 240 comprises silicon oxide formed by thermal oxidation or chemical oxidation. In one embodiment, the optional liner 240 comprises silicon nitride formed by thermal nitridation. In one embodiment, no liner is formed under the spacer 241. In one embodiment, the spacer 241 comprises silicon nitride formed by chemical vapor deposition (CVD) or by thermal nitridation formed by CVD. In one embodiment, the spacer protection layer 242 comprises silicon oxide formed by radical based oxidation or in-situ stream generation (ISSG) oxidation to convert a portion of the nitride spacer into oxide. In one embodiment, the spacer protection layer 242 is formed by chemical vapor deposition (CVD). Optionally, one or more annealing processes can be performed after forming each or all layers.

Figure 11:
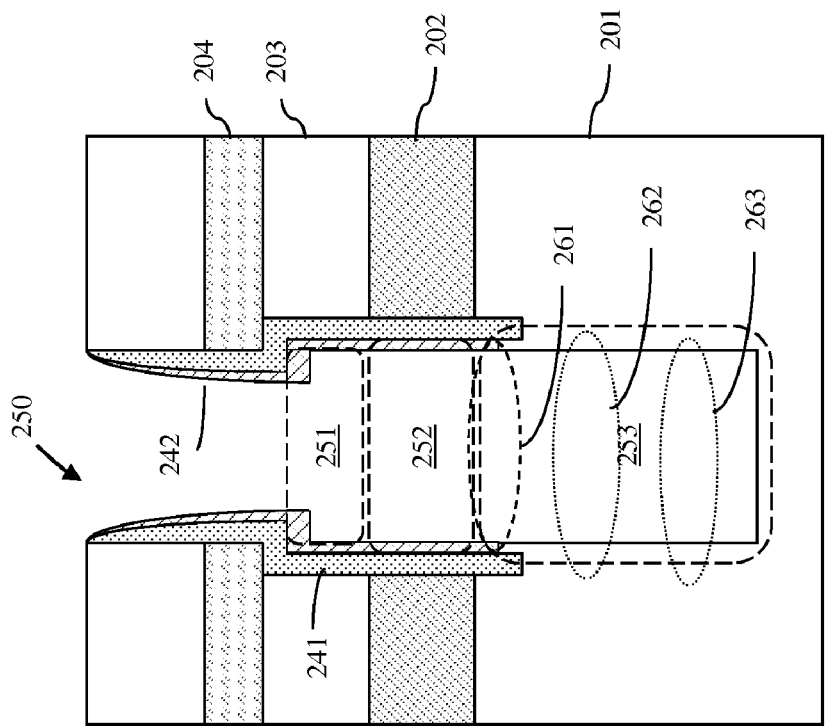
FIG. 11 is a schematic diagram illustrating a partially completed deep trench structure.

Referring to FIG. 11, in which the optional liner 240 is omitted (i.e. not shown), the spacer protection layer 242 and the spacer layer 241 are etched such that the remaining material 241-242 forms the multi-layer spacer covering the sidewalls of the first section 251 of the trench 250 in the SOI layer (i.e., the semiconductor layer 203), the sidewalls of the second section 251 of the trench in the buried oxide (BOX) layer (i.e., the insulator layer 202) and the sidewalls of the upper portion 261 of the third section 253 of the trench in the substrate 201 (see steps 608-612 of FIG. 6).

Then, during the second etch and pull back processes 614-616 in this method embodiment, the substrate 201 is etched such that portions 261-263 of the third section 253 of the deep trench 250 have different shapes at different depths (see step 618). That is, as mentioned above, during process 617, the first shape of the first section 251, the second section 252 and the upper portion 261 of the third section 253 can comprise an oval shape. However, referring to FIGS. 2a-2b, the substrate 201 can be etched during the second etch process 614 so that a mid-portion 262 of the third section 253 of the trench 250 (i.e., the second portion of the third section of the trench below the upper portion 261) has a second shape that is different from the first shape and so that the lower portion 263 of the third section 253 of the trench 250 (i.e., the third portion of the third section below the mid-portion) has a third shape that is different from the first shape and either the same or different from the second shape.

Etching the trench 250 with different shapes at different depths can be accomplished due to different etch rates at different crystallographic orientations. For example, referring to FIG. 2b, the mid-portion 262 of the third section 253 of the trench 250 may be formed with an octagonal shape (see shape E1-E1) with alternating {110} and {100} planes in the region below bottle neck (i.e., below the upper portion 261) or with a rectangle shape with all {100} planes (see shape E1'-E1'). The shape of the trench 250 may further stay the same or be changed, for example, from an octagon shape to a rectangular shape (see shape F1-F1) with all {110} planes at the region close to trench bottom when wafer surface belongs to one of {100} planes. That is, as discussed above, the first etch process 604 can produce oval shapes (see shapes B1-B1, C1-C1 and D1-D1) in the first section 251, second section 252 and upper portion 261 of the third section 253 of the trench 250, respectively, whereas, due to different etch rates the mid-portion 262 of the third section 253 can be formed with an octagon shape (see shape E1-E1) and the lower portion 263 of the third section 253 can be formed with rectangle shape (see shape F1-F1).

Figure 12:
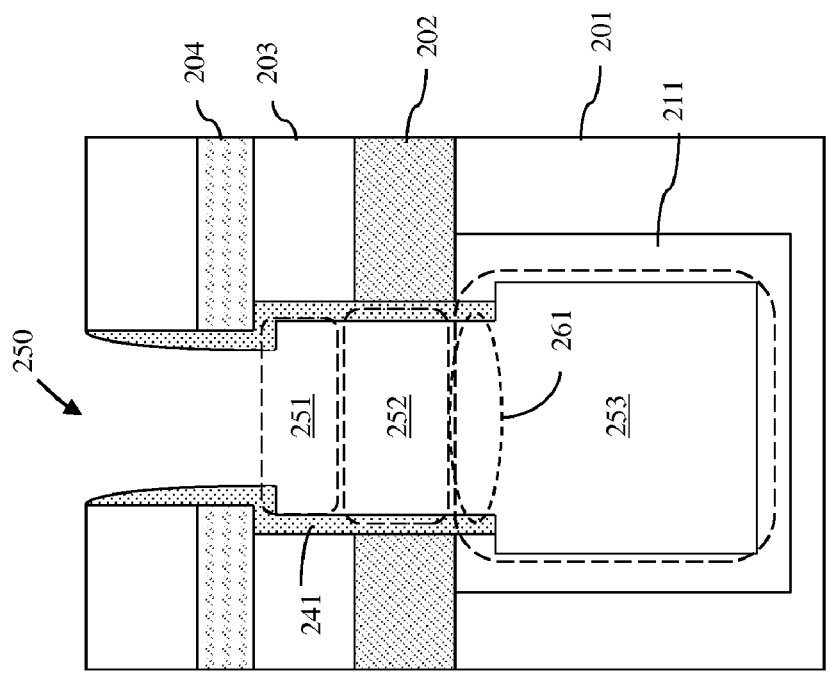
FIG. 12 a schematic diagram illustrating a partially completed deep trench structure.

Additionally, referring to FIG. 12, after the mid and lower portions 262, 263 (i.e., second and third portions) of the third section 253 of the deep trench 250 are etched, the sidewalls of the mid and lower portions can optionally be pulled back (i.e., etched parallel to the substrate surface to remove portions of the substrate and widen mid and lower portions of the third section of the trench) so that they are wider than the upper portion 261 (i.e., the first portion) of the third section 253 as well as wider than the first and second sections 251-252. The sidewalls of the mid and lower portions 262, 263 can be pulled back (i.e., etched approximately parallel to the substrate) by using an isotropic etch process so that their shape is retained (see shape E1-E1 in FIG. 2b) (i.e., so that the mid-portion retains the octagon shape and so that the lower portion retains the rectangle shape). This isotropic etch can be accomplished by a wet etch process with an etchant containing nitric hydrofluoric acid, a plasma etch, and a chemical downstream etch (CDE) can be used for isotropic silicon etch. Alternatively, the sidewalls of the mid and lower portions 262, 263 can be pulled back (i.e., etched approximately parallel to the substrate) by using an anisotropic etch process which has different etch rates at different crystallographic orientations. Consequently, the shape in the mid portion 262 changes from an octagon shape to a rectangle shape (see shape E1'-E1' in FIG. 2b). The anisotropic silicon etch process can be accomplished by a wet process (e.g., a process with an etchant containing ammonium hydroxide, tetramethylammonium hydroxide (TMAH), hydrazine, ethylene diamine-pyrocatechol (EDP), alkaline solutions (e.g., potassium hydroxide (KOH), etc.) or a dry etch process (e.g., plasma etch, reactive ion etch, chemical dry etch, etc.).

In another embodiment of the method the semiconductor layer 303, the insulator layer 302 and the top surface of the substrate 301 are also all etched during the first etch process to form a first section 351 of the trench 350 in the semiconductor layer 303, a second section 352 of the trench 350 in the insulator layer 302 and an upper portion 361 (i.e., first portion) of a third section 353 of the trench 350 in the substrate 301 (step 604 in FIG. 6, see FIG. 8). As mentioned above, this step 604 can be accomplished using conventional lithographic and selective RIE techniques. However, referring to FIGS. 13a-13b in combination, in this exemplary embodiment the sidewalls of the first section 351 in the semiconductor layer 303 and the sidewalls of the upper portion 361 of the third section 353 in the substrate are pulled back (i.e., etched approximately parallel to the substrate to remove portions of the semiconductor layer and substrate to widen the first section and upper portion of the second section of the trench) at process 606 using an anisotropic etch process and the sidewalls of the second section 352 of the trench 350 in the insulator layer 302 are pulled back (i.e., etched approximately parallel to the substrate to remove portions of the insulator layer to widen the second section of the trench) using an isotropic etch (step 619 in FIG. 6). Thus, the first section 351 and upper portion 361 of the third section 353 of the deep trench 350 will have a first shape (e.g., a rectangle shape, see B1-B1 and D1-D1) and the second section 352 of the deep trench 350 will have a second shape (e.g., an oval shape, see shape C1-C1) that is different from the first shape.

Specifically, the pull back of the sidewalls of the second section 352 of the trench 350 in the buried oxide (BOX) layer (i.e., the insulator layer 302) (i.e., the etching of the insulator layer parallel to the substrate surface to remove portions of the insulator layer and widen the second section of the trench) can be accomplished using the same wet or dry etch processes used for pulling back the insulator layer 202 of the previously described embodiment (see discussion above) such that the shape of the second section is retained. However, in this exemplary embodiment the sidewalls of the first section 351 of the trench 350 in the SOI layer (i.e., the semiconductor layer 303) and the sidewalls of the upper portion 361 of the third section 353 of the trench 350 in the substrate 301 are pulled back (i.e., etched parallel to the substrate surface to remove portions of the semiconductor layer and substrate to widen the first section and upper portion of the third section of the trench) by an anisotropic silicon etch process rather than an isotropic silicon etch process, which has different etch rates at crystallographic orientations, such that the shape of the first section and upper portion of the third section changes. The anisotropic silicon etch process may comprise a wet process (e.g., a process with an etchant containing ammonium hydroxide, tetramethylammonium hydroxide (TMAH), hydrazine, ethylene diamine-pyrocatechol (EDP), alkaline solutions (e.g., potassium hydroxide (KOH), etc.) or a dry etch process (e.g., plasma etch, reactive ion etch, chemical dry etch, etc.).

As with the previously described method embodiment, in this embodiment, the pull back (at process 606) of the sidewalls of the second section 352 of the trench 350 in the insulator layer 302 and the upper portion 361 of third section 353 of the trench 350 in the substrate 301 can be completed by performing two separate processes. Alternatively, the pull back (at process 606) of the sidewalls of the second section 352 and the upper portion 361 of the third section 353 can be completed in an integrated process comprising two steps. For example, an integrated process comprising a buffered hydrofluoric acid (BHF) etch followed by an ammonium hydroxide etch or, alternatively, an ammonium hydroxide etch followed by a BHF etch.

More specifically, due to the anisotropic etch used during the pull back of the semiconductor layer 303 and upper portion 361 of the substrate at process 606 in this embodiment, the trench shapes in the silicon regions (i.e., in the first section 351 of the trench 350 in the SOI layer 303 and in the upper portion 361 of the third section 353 of the trench 350 in the silicon substrate 301 below the BOX layer 302) change from, for example, an oval shape to a rectangular shape (see shapes B1-B1 and D1-D1). However, since an isotropic etch is still used for the pull back of the insulator layer, the trench shapes in the pad layer 304 and BOX layer 302 remain the same as the oval shape in the hardmask layer (see shapes A0-A0, A1-A1 and C1-C1) as illustrated in plan view of FIG. 13b.

Additionally, the anisotropic silicon pullback also creates unique notched features 331 (i.e., corners) in the first section 351 of the trench 350 in semiconductor layer 303 and in the upper portion 361 of the third section 353 of the trench 350 in the substrate 301 (i.e., just below the BOX layer 302). The notches 331 in first section 351 of the trench will increase the contact area between the semiconductor layer 303 and the conductive fill material 315 which will subsequently fill the trench 350 (see discussion below).

In this embodiment, the optional oxide liner and multi-layer spacer (i.e., spacer protection layer and spacer) formed at processes 608-612 can be formed in the same manner as described above with regard to the previous embodiment.

Then, during the second etch and pull back processes 614-616 in this method embodiment, the substrate 301 is also etched such that portions 361-363 of the third section 353 of the deep trench 350 have different shapes at different depths (620). Referring to FIGS. 3a-3b, the substrate 301 can be etched during the second etch process 614 so that a mid-portion 362 of the third section 353 of the trench 350 (i.e., the second portion of the third section of the trench below the upper portion 261) has a third shape (e.g., an octagon shape) that is different from the first shape (e.g., the rectangle shape) of the first section 351 and different from the second shape (e.g., oval shape) of the second section 352. The substrate 301 can further be etched so that the lower portion 363 of the third section 353 of the trench 350 (i.e., the third portion of the third section below the mid-portion) has the same first shape (e.g., a rectangle) as the first section 351 and upper portion 361 of the third section. As with the previously described embodiment, etching the trench 350 with different shapes at different depths can be accomplished due to different etch rates at different crystallographic orientations. For example, the mid-portion 362 of the third section 353 of the trench 350 may be formed with an octagonal shape (see shape E1-E1) with alternating {110} and {100} planes in the region below the upper portion 361. The shape of the trench 350 may further be changed to a rectangular shape (see shape F1-F1) with all {110} planes at the region close to trench bottom when wafer surface belongs to one of {100} planes.

Furthermore, as with the previously described embodiment, after the mid and lower portions 362-363 (i.e., second and third portions) of the third section 353 of the deep trench 350 are etched, the sidewalls of the mid and lower portions can optionally be pulled back (i.e., etched approximately parallel to the substrate to remove portions of the substrate and widen the mid and lower portions of the third section of the trench) so that they are wider than the upper portion 361 (i.e., the first portion) of the third section 353. The sidewalls of the mid and lower portions 362, 363 can be pulled back by using an isotropic etch process so that their shape is retained (see shape E1-E1 in FIG. 3b) (i.e., so that the mid portion retains the octagon shape and so that the lower portion retains the rectangle shape). This isotropic etch process can be accomplished, for example, by a wet etch process with an etchant containing nitric hydrofluoric acid, a plasma etch, and a chemical downstream etch (CDE) can be used for isotropic silicon etch. Alternatively, the sidewalls of the mid and lower portions 362, 363 are pulled back by using an anisotropic etch process which has different etch rates at different crystallographic orientations. Consequently, the shape in the mid portion 362 changes from an octagon shape to a rectangle shape (See shape E1'-E1' in FIG. 3b). This anisotropic silicon etch process can be accomplished by a wet process (e.g., a process with an etchant containing ammonium hydroxide, tetramethylammonium hydroxide (TMAH), hydrazine, ethylene diamine-pyrocatechol (EDP), alkaline solutions (e.g., potassium hydroxide (KOH), etc.) or a dry etch process (e.g., plasma etch, reactive ion etch, chemical dry etch, etc.).

Referring to FIGS. 2a and 3a, once the deep trench 250, 350 is formed, regardless of the shape, a capacitor 210, 310 can be formed in the substrate 201, 301 (step 622 in FIG. 6). Specifically, the region of the substrate 201, 301 adjacent to the third section 253, 353 can be optionally doped (e.g., with an n-type dopant, such as phosphorus (P), arsenic (As) or antimony (Sb) or with a p-type dopant, such as boron (B), gallium (Ga), indium (In), and thallium (Tl)) so as to form a first conductive plate 211, 311 (i.e., a buried plate) (step 624 in FIG. 6). This buried plate (i.e., a heavily doped region in the substrate next to the trench) can be formed by any known or future developed technique, including but not limited to, gas phase doping, liquid phase doping, solid phase doping, plasma doping, ion implantation, plasma immersion ion implantation, cluster ion implantation, infusion doping, or any suitable combination of these techniques. During this doping process, the spacer (i.e., the spacer 261, 361 formed at process 610) functions as a mask to protect the insulator layer 202, 302 and to prevent undesired doping of the semiconductor layer 203, 303. It should be noted that the process 624 of forming the buried plate can be performed before or after the optional process 616 of widening the third section of the trench. Alternatively, process for forming the buried plate can be eliminated if the starting wafer starts with a heavily doped substrate 201, 301.

Next, any remaining spacer material may optionally be stripped from the deep trench 250, 350, for example, by using conventional nitride removal techniques, such as hydrofluoric/ethylene glycol (HF/EG), hot phosphoric acid, chemical dry etch, etc. It should be noted that if the spacer material is not stripped it will remain in the final capacitor structure.

Then, the trench 250, 350 can be lined with a node dielectric liner 212, 312. The node dielectric liner 212, 312 can be formed using any suitable dielectric material, including but not limited to silicon oxide, silicon nitride, silicon oxynitride, high-k material, and any combination of these materials. Examples of suitable high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, an any combination of these materials. The liner 212, 312 can be formed using any deposition technique, including but not limited to, oxidation, nitridation, atomic layer deposition (ALD), chemical vapor deposition (LPCVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), ion beam deposition, electron beam deposition, laser assisted deposition, and any suitable combination of these techniques.

Once the trench is lined with the dielectric 212, 312, it may be filled with a conductive fill material 215, 315, thereby, forming a second conductive plate 213, 313 in the third section 253, 353 of the deep trench 250, 350 (step 628 in FIG. 6). For example, the trench may be filled with a polycrystalline or amorphous silicon, germanium, silicon germanium, a metal (e.g., tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), or any suitable combination of these materials. The conductive fill material 215, 315 can further be doped with a p-type dopant (e.g., boron (B), gallium (Ga), indium (In), and/or thallium (Tl)) or heavily doped with an n-type dopant (e.g., phosphorus (P), arsenic (As) and/or antimony (Sb)). The conductive fill material 215, 315 can be formed by any known or future developed deposition technique, including but not limited to, atomic layer deposition (ALD), chemical vapor deposition (LPCVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), high temperature oxide deposition (HTO), low temperature oxide deposition (LTO), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition, laser assisted deposition, and any combination of these techniques.

After the trench is filled, any remaining hardmask can be stripped and standard processes can be performed to form a memory device with a transistor connected to the trench capacitor (step 630 in FIG. 6). Referring to FIGS. 4 and 5, shallow trench isolation regions 270, 370 may be formed to isolate the memory device from adjacent devices. Specifically, a transistor 220, 320 (e.g., a metal oxide semiconductor field effect transistor) can also be formed adjacent to the capacitor 210, 310 so as to form a memory device 200 of FIG. 4 and memory device 300 of FIG. 5 (e.g., an embedded dynamic random access memory (eDRAM) device). This transistor 220, 320 can be formed using conventional processing techniques such that a source/drain region 229, 329 of the transistor 220, 320 is positioned in the semiconductor layer 203, 303 adjacent (i.e., contacting) the first section 251, 351 of the deep trench such that it is electrically connected to the capacitor 210, 310 in the third section 253, 353 via a conductive strap 230, 330 (i.e., the conductive fill material 215, 315 in the first section 251, 351 and the second section 252, 352 of the deep trench). The transistor 220, 320 further comprises a channel region 226, 326, a gate dielectric 224, 324, and a gate conductor 222, 322. Additionally, referring specifically to FIG. 3a, if the first section 351 of the deep trench is formed with a shape other than an oval (e.g., a rectangular shape with corners 331, see the second embodiment discussed above) the source/drain region 329 can be formed such that it conforms to one of the corners 331 (i.e., a notch) maximizing the surface area contact between the conductive strap 330 and the source/drain region 329 and, thereby, minimizing the resistance between the transistor 320 and the capacitor 310.

Therefore, disclosed are embodiments of an improved deep trench capacitor structure and memory device (e.g., a dynamic random access memory (DRAM) or an embedded dynamic random access memory (eDRAM) device) that incorporates this deep trench capacitor structure. The deep trench capacitor and memory device embodiments are formed on a semiconductor-on-insulator (SOI) wafer such that the buried insulating layer remains intact following a deep trench etch process and, optionally, such that the deep trench of the deep trench capacitor has different shapes and sizes at different depths. By forming the deep trench with different shapes and sizes at different depths the capacitance of the capacitor can be selectively varied and the resistance of the buried conductive strap which connects the capacitor to a transistor in the memory device can be reduced.

Also disclosed are embodiments of a method of forming the deep trench capacitor and the memory device that incorporates this deep trench capacitor. Specifically, during the deep trench capacitor formation process, the buried insulating layer of a semiconductor-on-insulator (SOI) wafer is protected by a spacer. However, by pulling back both the SOI and buried insulating layers prior to forming the spacer an overhang in the pad layer is created. This overhang prevents the subsequently formed spacer from being damaged during a subsequent deep trench reactive ion etch (RIE) process. The spacer can further be protected by forming a thin spacer protection layer on the top surface of the spacer prior to the RIE process. Additionally, the processes used to etch and/or pull back each layer of the SOI wafer can be selectively varied so as to selectively vary the size and shape of the trench at different depths so as to selectively vary the capacitance of the trench capacitor as well as the resistance of a buried strap which connects the deep trench capacitor to another device (e.g., to a pass transistor of a DRAM).

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A method of forming a semiconductor structure, said method comprising:
   providing a semiconductor-on-insulator structure comprising:
      a semiconductor layer;
      an insulator layer below said semiconductor layer; and
      a substrate below said insulator layer;
   forming a pad layer above said semiconductor layer;
   performing a first etch process so as to expose said substrate and form a first section of a trench in said semiconductor layer and a second section of said trench in said insulator layer;
   removing portions of said semiconductor layer and said insulator layer to widen said first section and said second section of said trench such that edges of said pad layer overhang said first section and said second section;
   forming a spacer on sidewalls of said first section and said second section; and
   performing a second etch process to form a third section of said trench in said substrate below said second section.

2. The method of claim 1, further comprising, before said performing of said second etch process, forming on said spacer a protection layer of material having a substantially higher etch resistance than said spacer.

3. The method of claim 2, wherein said forming said protection layer comprises one of converting an exposed surface of said spacer into said protection layer and depositing said protection layer.

4. The method of claim 1, wherein said removing of comprises performing isotropic etch processes.

5. The method of claim 1, wherein said removing of said portions of said semiconductor layer comprises performing a chemical downstream etch process.

6. The method of claim 1, wherein during said performing of said first etch process, a top surface of said substrate is etched below said insulator layer, and
   wherein said method further comprises, during said removing of said portions of said semiconductor layer, removing portions of said top surface of said substrate to widen a first portion of said third section of said trench.

7. The method of claim 6, wherein said portions of said semiconductor layer, said portions of said insulator layer and said portions of said top surface of said substrate are removed such that said first section, said second section and said first portion of said third section have approximately a same first shape and same first width, and
   wherein said performing of said second etch process further comprises etching said substrate such that a second portion of said third section below said first portion has a second shape that is different from said first shape and such that a third portion of said third section below said second portion has a third shape that is different from said first shape.

8. The method of claim 7, wherein said first shape comprises an oval shape, said second shape comprises one of a rectangle shape and an octagon shape and said third shape comprises said rectangle shape.

9. The method of claim 1, further comprising, after said performing of said second etch process, removing portions of said substrate to widen said third section of said trench.

10. The method of claim 1, further comprising forming a capacitor in said substrate, wherein said forming of said capacitor comprises:
   forming a first conductive plate in said substrate adjacent to said third section;
   lining said trench with a dielectric liner; and
   filling said trench with a conductive fill material to form a second conductive plate in said third section of said trench.

11. The method of claim 10, further comprising forming a transistor adjacent to said capacitor so as to form a memory device,
   wherein said forming of said transistor comprises forming a source/drain region of said transistor in said semiconductor layer adjacent to said first section such that said source/drain region is electrically connected to said capacitor via a conductive strap created by said conductive fill material in said first section and said second section.

12. A method of forming a semiconductor structure, said method comprising:
- providing a semiconductor-on-insulator structure comprising:
  - a semiconductor layer;
  - an insulator layer below said semiconductor layer; and
  - a substrate below said insulator layer;
- forming a pad layer above said semiconductor layer;
- performing a first etch process to form a first section of a trench in said semiconductor layer and a second section of said trench in said insulator layer;
- removing portions of said semiconductor layer and said insulator layer to widen said first section and said second section of said trench such that edges of said pad layer overhang said first section and said second section;
- forming a spacer on sidewalls of said first section and said second section; and
- performing a second etch process to form a third section of said trench in said substrate below said second section,
- wherein portions of said semiconductor layer and said insulator layer are removed such that said first section has a first shape and said second section has a second shape that is different from said first shape.

13. The method of claim 12, wherein said removing of said portions of said semiconductor layer comprises performing an anisotropic etch process.

14. The method of claim 12, further comprising:
- before said performing of said second etch process, forming on said spacer a protection layer of material having a substantially higher etch resistance than said spacer,
- wherein said forming of said protection layer comprises one of converting an exposed surface of said spacer into said protection layer and depositing said protection layer.

15. The method of claim 12, wherein during said first etch process a top surface of said substrate is etched so as to form a first portion of said third section,
- wherein, during said removing of said portions of said semiconductor layer, simultaneously removing portions of said top surface of said substrate such that said first portion of said third section of said trench is widen and such that said first portion has said first shape, and
- wherein said performing of said second etch process comprises etching said substrate below said first portion such that a second portion of said third section has a third shape that is different from said second shape.

16. The method of claim 15, wherein said first shape comprises a rectangle shape, said second shape comprises an oval shape and said third shape comprises one of said rectangle shape and an octagon shape.

17. The method of claim 15, wherein said performing of said second etch process further comprises etching said substrate below said second portion such that a third portion of said third section below said second portion has said first shape.

18. The method of claim 12, further comprising forming a capacitor in said substrate, wherein said forming of said capacitor comprises:
- forming a first conductive plate in said substrate adjacent to said third section;
- lining said trench with a dielectric liner; and
- filling said trench with a conductive fill material to form a second conductive plate in said third section of said trench.

19. The method of claim 18, further comprising forming a transistor adjacent to said capacitor so as to form a memory device,
- wherein said forming of said transistor comprises forming a source/drain region of said transistor in said semiconductor layer adjacent to said first section such that said source/drain region is electrically connected to said capacitor via a conductive strap created by said conductive fill material in said first section and said second section, and
- wherein said first shape of said first section comprises a rectangular shape that maximizes surface area contact between said conductive strap and said source/drain region to minimize resistance between said transistor and said capacitor.

* * * * *